(12) United States Patent
Rajwade et al.

(10) Patent No.: US 12,394,492 B2
(45) Date of Patent: Aug. 19, 2025

(54) MEMORY CELL SENSING CIRCUIT WITH ADJUSTED BIAS FROM PRE-BOOST OPERATION

(71) Applicant: Intel NDTM US LLC, Santa Clara, CA (US)

(72) Inventors: Shantanu R. Rajwade, Santa Clara, CA (US); Bayan Nasri, Folsom, CA (US); Tzu-Ning Fang, Palo Alto, CA (US); Rezaul Haque, Folsom, CA (US); Dhanashree R. Kulkarni, El Dorado Hills, CA (US); Narayanan Ramanan, San Jose, CA (US); Matin Amani, Fremont, CA (US); Ahsanur Rahman, Folsom, CA (US); Seong Je Park, San Jose, CA (US); Netra Mahuli, Folsom, CA (US)

(73) Assignee: Intel NDTM US LLC, Santa Clara, CA (US)

(*) Notice: Subject to any disclaimer, the term of this patent is extended or adjusted under 35 U.S.C. 154(b) by 1113 days.

(21) Appl. No.: 17/107,679

(22) Filed: Nov. 30, 2020

(65) Prior Publication Data

US 2022/0172784 A1   Jun. 2, 2022

(51) Int. Cl.
*G11C 16/26* (2006.01)
*G11C 13/00* (2006.01)
*G11C 16/04* (2006.01)

(52) U.S. Cl.
CPC .......... *G11C 16/26* (2013.01); *G11C 13/004* (2013.01); *G11C 16/0483* (2013.01)

(58) Field of Classification Search
CPC ... G11C 16/26; G11C 13/004; G11C 16/0483; G11C 7/12; G11C 16/24
See application file for complete search history.

(56) References Cited

U.S. PATENT DOCUMENTS

| | | |
|---|---|---|
| 2006/0285392 A1 | 12/2006 | Incarnati et al. |
| 2007/0109845 A1 | 5/2007 | Chen |
| 2009/0161436 A1* | 6/2009 | Abiko ............... G11C 8/10 365/185.24 |
| 2011/0075480 A1 | 3/2011 | Cernea |
| 2011/0261625 A1 | 10/2011 | Nguyen et al. |
| 2014/0347928 A1 | 11/2014 | Lee |
| 2016/0019949 A1 | 1/2016 | Raghunathan et al. |
| 2017/0062062 A1* | 3/2017 | Tanabe ............... G11C 16/20 |

(Continued)

*Primary Examiner* — Donald H B Braswell
(74) *Attorney, Agent, or Firm* — Morgan, Lewis & Bockius LLP

(57) ABSTRACT

A sense circuit performs a multistage boost, including a boost during precharge operation and a boost during the standard boost operation. The sense circuit includes an output transistor to drive a sense output based on current through a sense node which drives a gate of the output transistor. The sense circuit includes a precharge circuit to precharge the sense node and the gate of the output transistor and a boost circuit to boost the sense node. The boost circuit can be boosted during precharge by a first boost voltage, resulting in a lower boost applied to the sense node after precharge. The boost circuit boosts up the sense node by a second boost voltage lower than the first boost voltage. The boost circuit boosts the sense node down by the full boost voltage of the first boost voltage plus the second boost voltage after sensing.

22 Claims, 10 Drawing Sheets

(56) References Cited

U.S. PATENT DOCUMENTS

| | | | |
|---|---|---|---|
| 2019/0355397 A1* | 11/2019 | Ishizu | H10D 86/423 |
| 2020/0066350 A1 | 2/2020 | Moschiano et al. | |
| 2020/0075076 A1* | 3/2020 | Lee | G11C 11/4091 |
| 2020/0111529 A1 | 4/2020 | Shin | |
| 2020/0194070 A1 | 6/2020 | Lee | |
| 2022/0051723 A1* | 2/2022 | Shin | G11C 16/10 |

* cited by examiner

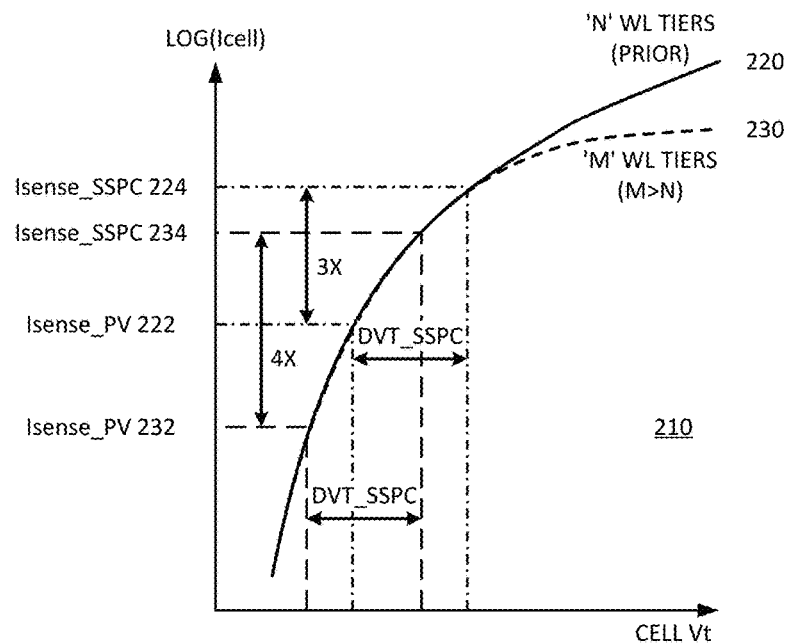
FIG. 2
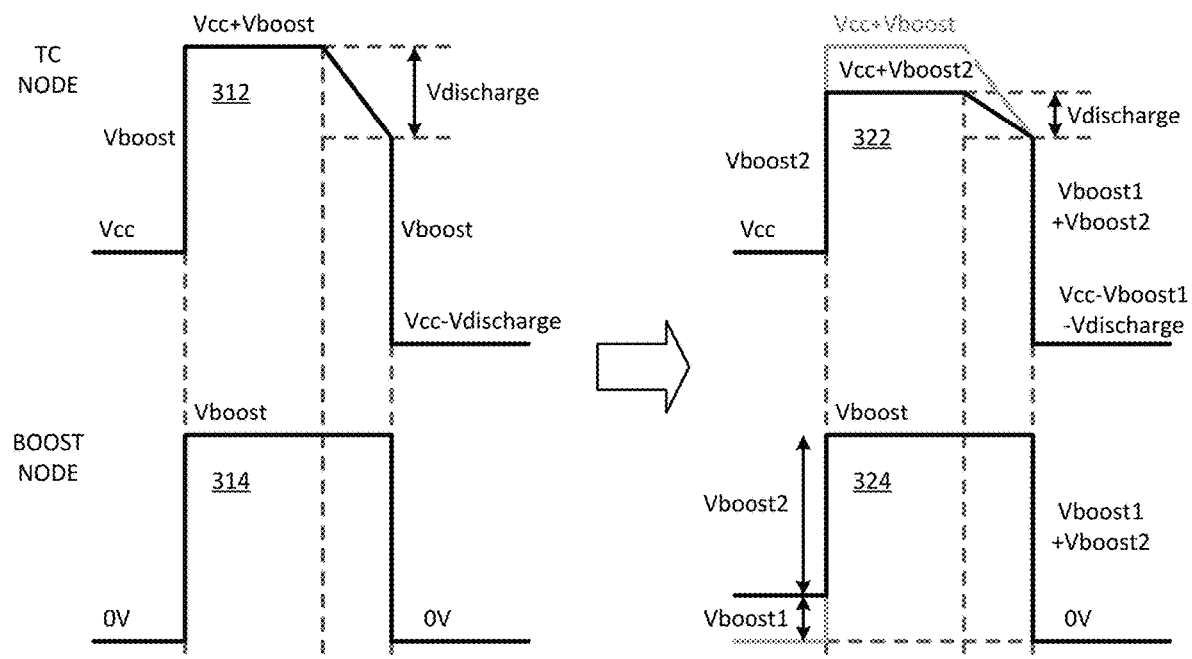
FIG. 3A
(PRIOR ART)
FIG. 3B

MEMORY CELL SENSING CIRCUIT WITH ADJUSTED BIAS FROM PRE-BOOST OPERATION

FIELD

Descriptions are generally related to memory cells, and more particular descriptions are related to adjusting the sensing bias with a multilevel boost operation.

BACKGROUND

To increase bit density in memory devices or storage device, the arrays can be arranged as three-dimensional (3D) memory arrays with bit cells in vertical stacks. Traditional arrays are planar, with bit cells arranged in horizontal planes. The 3D devices can include vertical stacks of horizontal planes. Vertical stacking can increase the bit density per unit of integrated circuit area because the cells can be formed around vertical channels instead of only around a horizontal channel. Stacked memory arrays have strings of bits that can be controlled with a string driver.

When scaling 3D devices, the total number of wordlines in the array tends to increase the length of the string of bit cells, which reduces the ON current, or the selection current for a selected wordline. Reduced selection current results in sense current reduction, which is especially prominent as the device ages. The penalty for reduced sense current includes increased sense time, which hinders performance. The penalty for reduced sense current can also include reduced read window budget margin, which increases error rate.

Generation over generation scaling of program times also leads to higher program voltage steps (Vpgm_step). However, increasing Vpgm_step also tends to reduce the sense margin to sense cells that need to be slowed down for selective slow programming convergence (SSPC) in a subsequent pulse.

BRIEF DESCRIPTION OF THE DRAWINGS

The following description includes discussion of figures having illustrations given by way of example of an implementation. The drawings should be understood by way of example, and not by way of limitation. As used herein, references to one or more examples are to be understood as describing a particular feature, structure, or characteristic included in at least one implementation of the invention. Phrases such as "in one example" or "in an alternative example" appearing herein provide examples of implementations of the invention, and do not necessarily all refer to the same implementation. However, they are also not necessarily mutually exclusive.

FIG. 2 is a diagrammatic representation of sense current and current for SSPC cells.

FIG. 3A is a representation of an example of traditional boost operation.

FIG. 3B is a representation of an example of multistage boost operation.

Descriptions of certain details and implementations follow, including non-limiting descriptions of the figures, which may depict some or all examples, and well as other potential implementations.

DETAILED DESCRIPTION

As described herein, a sense circuit performs a boost operation in multiple stages, or multiple levels of boost for the boost operation, instead of simply applying a single boost voltage. The multilevel boost can include a boost during precharge operation and a boost during the standard boost operation. The sense circuit includes an output transistor to drive a sense output based on current through a sense node which drives a gate of the output transistor. The sense circuit includes a precharge circuit to precharge the sense node and the gate of the output transistor and a boost circuit to boost the sense node. The boost circuit can boost the sense node during precharge by a first boost voltage and then boost the sense node with a second boost voltage after the precharge. The first boost voltage is less than the full threshold voltage (Vt) of the output transistor, which controls turn-on of the output transistor. The second boost voltage boosts from the first boost voltage to a boost voltage.

The first boost can be considered a pre-boost from the perspective that the second boost would be the normal boost procedure. After application of the first boost, the normal boost procedure (with the second boost) will start from a voltage bias, rather than from zero volts. The application of a pre-boost voltage on the sense capacitor can change the reference for the sense Vt. Changing the reference for the sense Vt allows sensing at lower current without the performance penalty of needing to increase the sense time. Additionally, the pre-boost to change the sense reference can create sufficient margin for sensing at ever increasing differences in voltage discharge required for the application of selective slow programming convergence (SSPC) at the sense capacitor with program voltage step scaling.

With improvements in the sensing operation of the cells, the scaling to more wordlines (WLs) in a three-dimensional (3D) device can occur without the performance penalty associated with traditional approaches to sensing. The system applying the multistage boost can use SSPC cell targeting for higher program voltage (Vpgm) steps due to the improved sensing margin, as opposed to being limited by sensing margin with traditional sensing.

Figure 1:
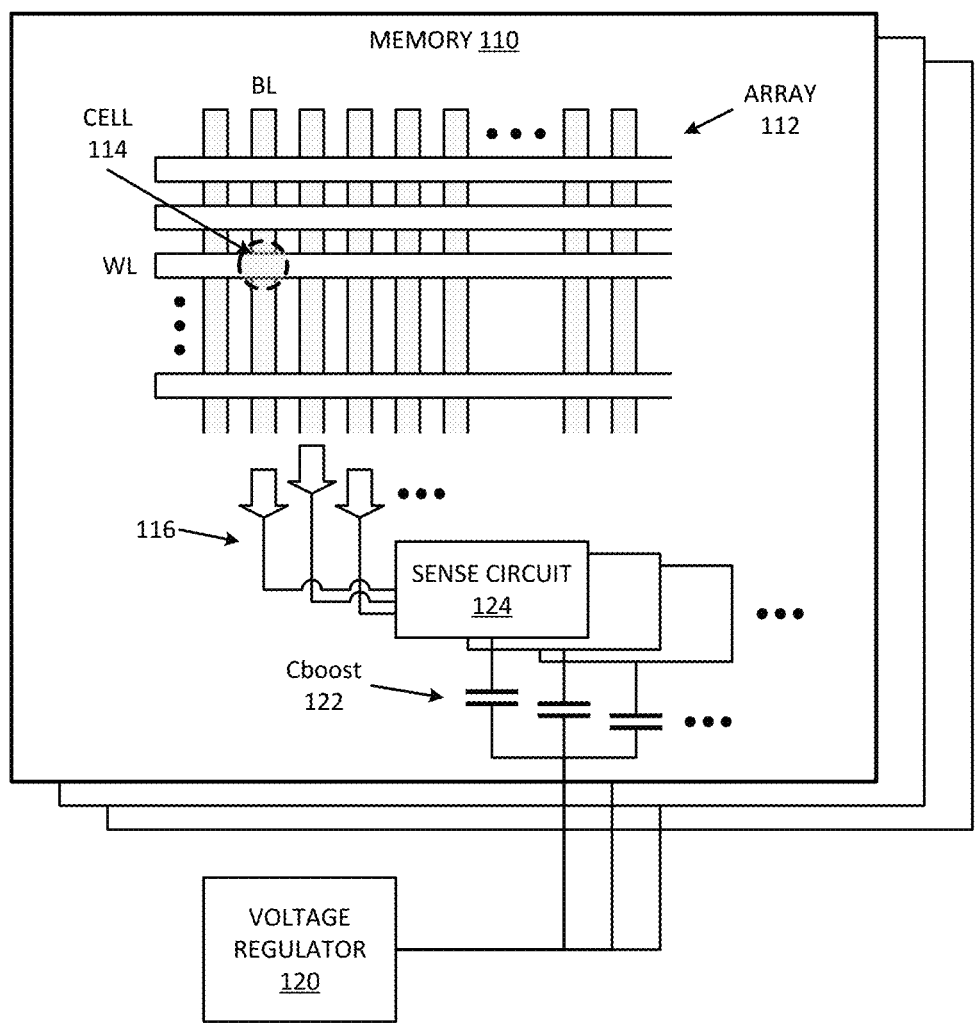
FIG. 1 is a block diagram of an example of a memory that senses a cell with a sense circuit that has a multistage boost operation.

FIG. 1 is a block diagram of an example of a memory that senses a cell with a sense circuit that has a multistage boost operation. Circuit 100 represents a nonvolatile (NV) memory circuit. In one example, circuit 100 represents a portion of a three-dimensional (3D) NAND (storage cells based on inverted AND gate configuration) memory, such as a 3D NAND flash device. In one example, circuit 100 represents a portion of a 3DXP (3D crosspoint) memory or other stacked memory.

Circuit 100 includes memory 110 having array 112, which represents an array of 3D memory. In one example, memory 110 represents a die or a chip and circuit 100 includes multiple memory dies. Array 112 includes wordlines (WLs) and bitlines (BLs). Array 112 includes multiple layers of WLs in a 3D stack. Array 112 can also include BLs in the 3D stack, with channels that extend vertically through the stacks. Array 112 includes cell 114 at the intersection of a BL and a WL. The WLs can be charged in response to a row address and the BLs can be charged in response to a column address. Cell 114 represents the multiple cells at the intersections of the various WLs and BLs, which can be referred to as bitcells or storage cells.

In one example, cell 114 represents a 3D (three dimensional) memory cell. The 3D memory cell can be a 3D NAND (three-dimensional Not AND) memory cell. In a 3D NAND array, the array architecture includes multiple tiers or layers of cells stacked on top of each other. Cell 114 can represent one cell of one of multiple tiers or layers in a stack of cells. In one example, the 3D memory cell can be a 3DXP (three-dimensional crosspoint) memory cell.

The arrows at the bottom of the BLs represent output lines 116 to the sense circuits. When the BL and the WL are selected, the charge from the cell is provided on output line 116 to sense circuit 124. Sense circuit 124 represents a circuit that determines the value stored in the cell, such as a zero or one for a single level cell (SLC), or such as a voltage level for a multilevel cell (e.g., triple level cell (TLC) or quad level cell (QLC)).

In one example, memory 110 includes boost circuits for sense circuits 124. The boost circuit can be or can include boost capacitor Cboost 122. Cboost 122 provides charge to sense circuit 124 to bias the sense circuit. Voltage regulator 120 represents circuitry to provide a bias voltage or charging voltage to Cboost 122.

In one example, voltage regulator 120 charges Cboost 122, and Cboost 122 can apply a pre-boost voltage on sense circuit 124. In one example, sense circuit 124 includes a sense capacitor, and Cboost 122 provides a pre-boost voltage to the sense capacitor, which changes the reference for the sensed Vt. The pre-boost allows sense circuit 124 to sense at a lower current without a performance penalty of needing to perform the sensing for a longer period of time. The pre-boost can allow sense circuit 124 to create sufficient margin for sensing at an increasing difference in voltage discharge required on the SSPC sense capacitor with program voltage step scaling.

Instead of performing a traditional boost at a single boost voltage, circuit 100 can provide boost in multiple stages. In one example, sense circuit 124 includes an output transistor to drive an output based on the input from cell output line 116. Sense circuit 124 includes a sense node or a node at which the output of the cell is detected. The output from sense circuit 124 is a digital value to represent the value sensed to be stored in the cell. In one example, sense circuit 124 includes a precharge circuit to precharge the sense node a gate of the sense circuit output transistor to a voltage reference prior to a sense operation or sensing by sense circuit 124.

Cboost 122 can represent a boost circuit to boost the sense node. Cboost can boost the sense node during precharge to increase the voltage of the sense node by a first boost voltage which is a portion of a threshold voltage (Vt) of the output transistor. A "portion" of Vt refers to a voltage level that is less than the full Vt level. A portion of a boost voltage refers to a level of voltage that is less than the full boost voltage level. The result of applying a voltage that is a portion of the total voltage is that another voltage increase must be applied to reach the final target voltage level. Cboost can boost the sense node after precharge to increase the voltage of the sense node by a second boost voltage greater than the Vt of the output transistor.

FIG. 2 is a diagrammatic representation of sense current for cells passing program verify and SSPC criteria. Traditionally, WL stacking in 3D arrays can reduce ON current and consequently reduces Isense (sense current) to support end-of-life (EOL) functionality at worst-case operating conditions. The system always needs a guard band between the cell current and the string current to allow for the operation of the system. Based on the architecture of the memory array and the string drivers, there is a need to have a higher string current to allow some overhead to ensure the proper driving of individual cells. A lower string current results in a lower cell current or the current used at the cell for sensing during the program verify (PV) operation. Thus, lower string current results in lower sense current.

Sensing at lower Isense in the traditional case results in two independent downsides: first, a performance downside of up to 5% due to increased tsense (sense time) to adjust for the lower Isense; and, second, under-optimized Vt placement from sub-optimal capture of SSPC (selective slow programming convergence) cells. SSPC cells refer to the memory cells that need to be slowed down for SSPC in a pulse subsequent to the initial verify pulse.

In general, the SSPC operation can be thought of as detecting how many cells lies between the PV and a next PV program voltage step, so as to not overcharge the cells that are close to the step boundaries. Applying a smaller program pulse to these cells can result in less charge being applied to the cells, which improved the Vt distribution among the cells. Thus, the effects of sensing at lower Isense can be expressed as 1) higher sense time and 2) increased difference between PV and SSPC current. A multistage boost can reduce or eliminate both effects.

Diagram 210 illustrates representative cell I-V (current-voltage) curves for different technology generations. The solid line of curve 220 represents the prior generation with N wordline (WL) tiers. The dashed line of curve 230 represents a subsequent generation with M WL tiers, where M>N. Curve 230 can be thought of as a representation of technology scaling from curve 220. It will be observed that curve 230 overlaps curve 220 for a significant portion of the curve. More specifically, the logarithmic cell current (LOG (Icell)) as a function of cell threshold voltage (Cell Vt) overlaps until a certain Cell Vt, at which point curve 230 does not have as high a cell current.

Isense_PV 222 of curve 220 represents a sense current for a program verify operation of the prior 3D array technology (N WL tiers). The sense current for a subsequent 3D array technology (M WL tiers) is lower, with Isense_PV 232 representing the sense current for program verify. The array with M WL tiers does not support the same Isense_PV of the array with N WL tiers.

Furthermore, for SSPC operation, the inherently steeper Log(I)-V characteristic of the curves increases the current difference between PV and ideal SSPC cells. In one example, the difference in current between PV and the ideal SSPC cells is determined by DVT_SSPC, which refers to a reference discharge voltage on the sense terminal (discharge voltage on terminal) for SSPC cells.

DVT_SSPC is dependent on the program step voltage and does not scale with the technology node. Thus, the reference discharge required for optimally capturing SSPC cells is increased when transitioning from the N WL tiers technology node to the M WL tiers technology node. Diagram 210 illustrates the difference in PV and SSPC current for curve 220 as nominally 3×, which increases to nominally 4× for curve 230. The difference is illustrated with the arrow between Isense_PV 222 and Isense_SSPC 224 for curve 220, and the arrow between Isense_PV 232 and Isense_SSPC 234.

The large amplitude of discharge (as an example, 4× for curve 230) required for the SSPC cells cannot be achieved on the sense node due to sense circuit limitations. Maximum discharge (DV_max) of the sense node during sensing is less than the discharge needed for the SSPC cells, resulting in suboptimal window for capturing SSPC cells during Vt placement. The inability to fully discharge the SSPC cells leads to higher variation in Vt placement.

The application of a multistage boost also improves the performance of technology scaling through program step increase. When the program step increases, the Vt difference between PV and ideal SSPC cell (DVT_SSPC) increases by the same magnitude. Maintaining DVT_SSPC between curve 220 and curve 230, while starting from a lower Isense for curve 230 results in the increased ratio between DV (discharge voltage for Isense_PV 232) and DV_SSPC (discharge voltage for the SSPC cell, at Isense_SSPC 234). The application of the multistage boost allows the full discharge without increasing the discharge time.

FIG. 3A is a representation of an example of traditional boost operation. Curve 312 represents a voltage response at a TC (terminal of capacitor) node, which is an example of a sense node for the system. The discharge and reading of the cell at the node can determine if the cell was triggered by the program verify voltage. The system discharges the node by connecting to the string to sense. The discharge in curve 312 is sufficient for the case of program verify, but cannot discharge enough for the SSPC case.

For the TC node, the circuit starts at a voltage of Vcc, which is a reference voltage. Vboost represents a boost voltage applied to a boost circuit coupled to the TC node. Curve 314 represents a voltage response for the boost node that couples to the TC node. In the traditional case of curve 314, the boost node starts at 0V, boosts to Vboost, and then discharges to 0V.

Because of the boost of the TC node by the boost node, curve 312 goes to Vcc+Vboost. After a charge time, the sense circuit connects the sense node to the memory cell string to read a selected memory cell. The sense node discharges Vdischarge over the sense time, and is then discharged Vboost to result in a final voltage of Vcc−Vdischarge.

FIG. 3B is a representation of an example of multistage boost operation. In contrast to the operation of the traditional boost illustrated by curve 312 and curve 314, curve 322 illustrates a voltage response for a TC node in which the boost is applied in stages. Curve 324 illustrates the voltage response for the boost node. Instead of starting at 0V, the system boosts the sense node to Vboost1. Thus, the node is biased above 0V to start the boost sequence. The biasing of the sense node can occur during the precharge of the sense circuit. Thus, curve 324 can start at Vboost1 and the system applies Vboost2 to the boost node. After application of Vboost2, the boost node is at Vboost, when Vboost=Vboost1+Vboost2. When the boost node discharges Vboost1+Vboost2, the boost node ends up at 0V. Thus, the boost up of the TC node is smaller for curve 322 than for curve 312, but the boost down is the same.

For curve 322, the node starts at Vcc as with curve 312. Since the boost node is pre-boosted to Vboost1, only Vboost2 is applied to the TC node. Instead of being boosted to Vcc+Vboost (shown in gray), curve 322 is boosted to Vcc+Vboost2. The reference discharge (DV) of the sense node, which is labeled as Vdischarge on the drawings, can be lowered when the total boost lowered because of pre-biasing the sense node. Thus, Vdischarge for curve 312 is larger than Vdischarge for curve 322.

The amount of time given to discharge (tsense) determines the sense current (Isense_PV=C_TC*DV/tsense, for a sense node having a capacitor to provide the boost to the sense node). It will be observed that with the lower Vdischarge of curve 322, the sense time can be the same for curve 322 as it is for curve 312.

In one example, the system applies the pre-boost of Vboost1 during precharge of a sense capacitor, which reduces the reference discharge for curve 322. With the lower discharge voltage, the sense current can be reduced by simply changing the pre_boost voltage applied to the boost node without sacrificing performance by extending the sense time. One result from boosting in multiple stages is that the lowering of Vdischarge can lower DV_SSPC by the same factor, with places the discharge voltage for the SSPC cells within the limits of the sensing circuit, which could otherwise be outside the limits. Putting DV_SSPC within the limits of the sensing circuit improves the Vt distribution, which in turn improves read window margin.

Figure 4:
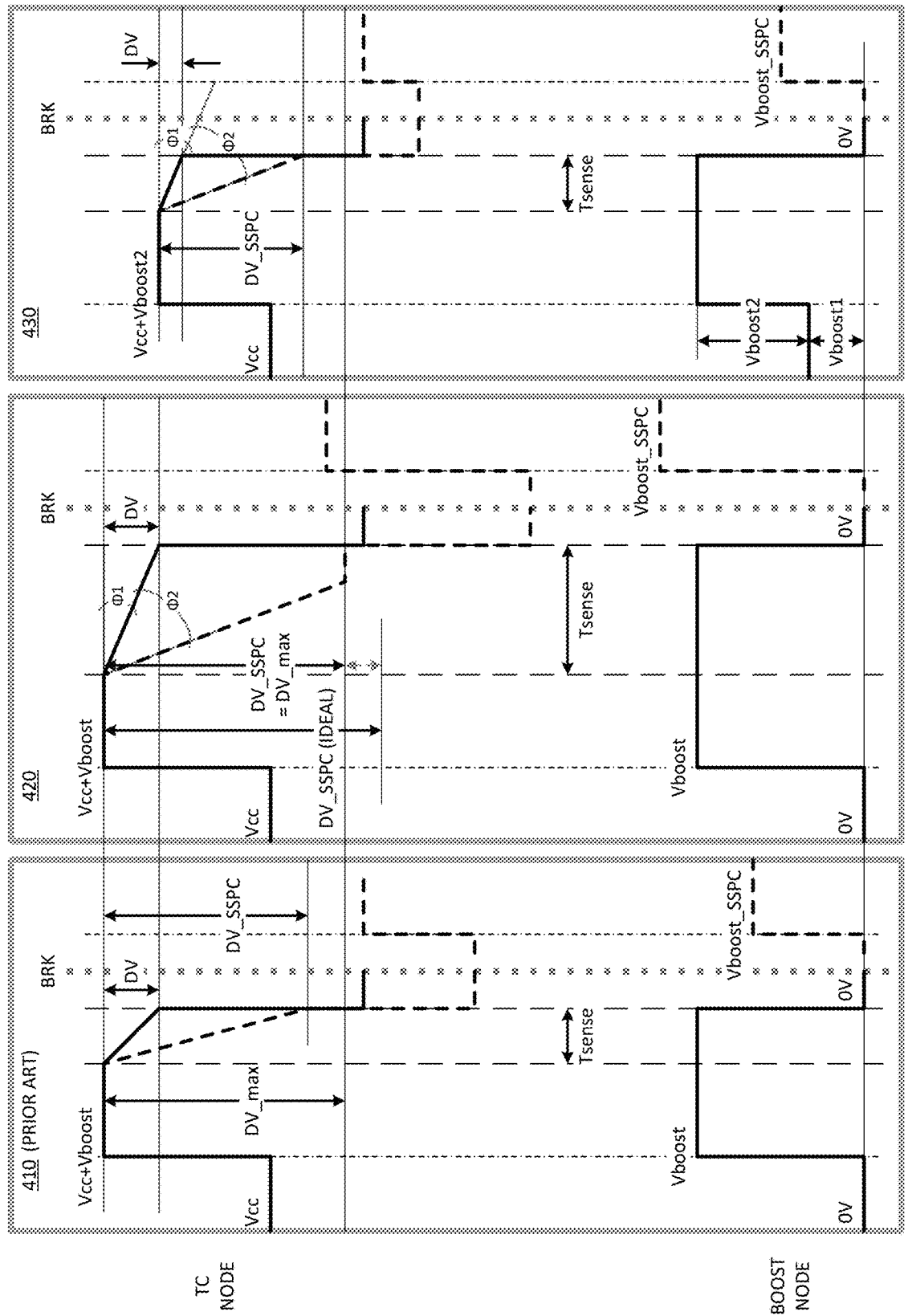
FIG. 4 is a diagrammatic representation of examples of the voltage at a sense node and a boost node.

FIG. 4 illustrates the voltages on the TC node for a PV cell and for an SSPC cell, as well as the voltage on the boost node. The system charges the sense node to Vcc, which is a reference voltage higher than zero, such as a center voltage reference. Diagram 410 and diagram 420 illustrate the traditional architecture where the system applies a pre-boost voltage to a boost circuit (e.g., a boost capacitor) of 0 V while the sense node (TC at the top terminal of the boost circuit) is charged to Vcc. Diagram 430 illustrates the system applying a pre-boost of Vboost1 to the boost circuit, which the sense node is charge to Vcc. The application of the pre-boost changes the bias of the boost node.

After the charging of the sense node (whether or not the boost is applied), in one example, the system floats the sense node, disconnecting the node from the charging circuit, and subsequently couples the sense node to a high voltage by applying a boost voltage to the other end of the boost circuit. After tsense (or alternatively, Tsense), in one example, the system reduces the boost voltage to the lowest allowable voltage value (e.g., 0 V) and connects the sense node to an output transistor in the sense path.

Referring specifically to the traditional architecture illustrated by diagram 410, diagram 410 provides a diagrammatic representation of an example of the voltage at the sense node (TC Node) and the Boost Node for traditional operation.

In diagram 410, the system keeps the Boost Node at 0 V during the precharge, and charges the TC Node to Vcc. After the charging the TC Node to Vcc, the system charges the Boost Node to Vboost and floats the TC Node. The system subsequently couples the Boost Node to the TC Node to apply the boost voltage to the sense node, resulting in a voltage of Vcc+Vboost to the TC Node. The discharge occurs over the period tsense. For a first pass with a PV cell, the solid line illustrates a discharge of DV. For a second pass for an SSPC cell, the dashed line illustrates a discharge of DV_SSPC. It can be observed that DV_SSPC is less than DV_max, which is the maximum discharge possible for the node.

After tsense, the system reduces the boost voltage to the lowest allowable voltage value (e.g., 0 V) and connects the sense node to an output transistor in the sense path. When the Boost Node is reduced, in the case of sensing a PV cell, the voltage at the TC Node will lower by the boost voltage and a discharge from the PV cell to Vcc−DV). For a pass to sense an SSPC cell, the discharge will lower the TC Node to Vcc−DV_SSPC. Thus, for an SSPC cell, after a time break (BRK), the system applies Vboost_SSPC to return the TC Node to the final voltage of the PV case.

Referring specifically to the architecture illustrated by diagram 420, diagram 420 provides a diagrammatic representation of an example of the voltage at the sense node (TC Node) and the Boost Node for boost operation with extending sense time. Diagram 420 illustrates that when the sense current is lower the local cell subthreshold slope improves, increasing the optimal discharge. In one example, the increased magnitude of the discharge cannot be support on the TC Node, because the discharge is clamped above a voltage level, which can be dependent on source voltage and BL bias.

In essence, diagram 420 illustrates the application of a new array technology (cell architecture and increased tiers of WLs) to the traditional sense architecture. As with diagram 410, in diagram 420, the system keeps the Boost Node at 0 V during the precharge, and charges the TC Node to Vcc. After the charging the TC Node to Vcc, the system charges the Boost Node to Vboost and floats the TC Node. The system subsequently couples the Boost Node to the TC Node to apply the boost voltage to the sense node, resulting in a voltage of Vcc+Vboost to the TC Node.

With the new array technology, the Isense_PV is lower, resulting in a longer tsense to maintain the same DV. It will be observed that DV is the same in diagram 420 as it is in diagram 410, but comes at the cost of a tsense that is more than twice that of diagram 410. The longer tsense degrades performance by taking longer to read the memory device.

For sensing a PV cell, the solid line illustrates a discharge of DV. For sensing an SSPC cell, the dashed line illustrates a discharge of DV_SSPC=DV_max. In addition to the longer sense time, it will be observed that due to the steeper subthreshold slope of the cell I-V, the required ideal DV_SSPC (Ideal) exceeds DV_max, which clamps the TC Node discharge for SSPC cells. The inability to discharge sufficiently to detect the SSPC cells makes the SSPC cells indistinguishable from other cells that are further away from the desired PV, which negatively impacting Vt distribution. The longer sense time and poor Vt distribution lead to suboptimal performance and read window budget.

After tsense, the system reduces the boost voltage to the lowest allowable voltage value (e.g., 0 V) and connects the sense node to an output transistor in the sense path. When the Boost Node is reduced, in the case of sensing a PV cell, the voltage at the TC Node will lower by the boost voltage to Vcc−DV). For a pass to sense an SSPC cell, the discharge will lower the TC Node to at most Vcc−DV_max. For an SSPC cell, after a time break (BRK), the system applies Vboost_SSPC to return the TC Node to Vcc−DV or a voltage approximately the same as for the PV case. Vboost_SSPC in this case is greater than it was for case discussed in diagram 410.

Referring specifically to the architecture illustrated by diagram 430, diagram 430 provides a diagrammatic representation of an example of the voltage at the sense node (TC Node) and the Boost Node for multistage boost operation. In diagram 430, the application of Vboost1 as a pre-boost or a first stage of boost starts the Boost Node at a bias of Vboost1 instead of 0 V. The higher bias on the boost side of the boost circuit will result in a lower boost on the sense node side of the boost circuit. In one example, the application of Vboost1 is during a precharge of the TC Node to VCC. Thus, when the boost is applied from the Boost Node to the TC Node, the remaining boost (Vboost1) is applied to the TC Node during the boosting phase or boosting operation.

Thus, in diagram 430, the system boosts the Boost Node to Vboost1 during the precharge, and charges the TC Node to Vcc. After the charging the TC Node to Vcc, the system charges the Boost Node with Vboost2 and floats the TC Node. The system subsequently couples the Boost Node to the TC Node to apply the boost voltage to the sense node, resulting in a voltage of Vcc+Vboost2 to the TC Node, which is Vboost1 lower than Vcc+Vboost. With the new array technology, the Isense_PV is lower, but with Vboost1 and Vboost2 selected to match the curve of the new Isense current, tsense can be maintained at the same period as in diagram 410, avoiding the performance degradation of diagram 420. Thus, there is no performance degradation compared to the existing architecture, since the amount of TC discharge for the PV cell is lowered, allowing the same sense time.

For sensing a PV cell, the solid line illustrates a discharge of DV, which is a much lower DV than in diagram 410 or diagram 420. For sensing an SSPC cell, the dashed line illustrates a discharge of DV_SSPC, which is also lower than DV_SSPC of diagram 410 or DV_SSPC of diagram 420. It will be observed in diagram 430 that DV_SSPC is lower than DV_max, allowing the system to properly distinguish SSPC cells from PV cells. Seeing that DV_max is greater than DV_SSPC in diagram 430, the system can improve the placement of Vt or the Vt distribution by capturing the ideal SSPC cells.

Keeping the boost down voltage of 0 V unchanged, the Boost Node drops from Vboost to 0 V, which is Vboost1 lower than the level to which the TC Node was boosted. Vboost1 can be varied to change the reference discharge required for sensing. Thus, after tsense, the system reduces the boost voltage to the lowest allowable voltage value (e.g., 0 V) and connects the sense node to an output transistor in the sense path. When the Boost Node is reduced, in the case of sensing a PV cell, the voltage at the TC Node now be Vcc−DV (note the DV in this case is smaller than the case shown in diagram 420). For sensing an SSPC cell, the final voltage on the TC node will be Vc−DV_SSP (note that the DV_SSPC for 430 is smaller than DV_SSPC for 420). For an SSPC cell, after a time break (BRK), the system can applies Vboost_SSPC (lower than the Vboost_SSPC of diagram 410 or of diagram 420) to return the TC Node to approximately the same level as for the PV case.

Figure 5A:
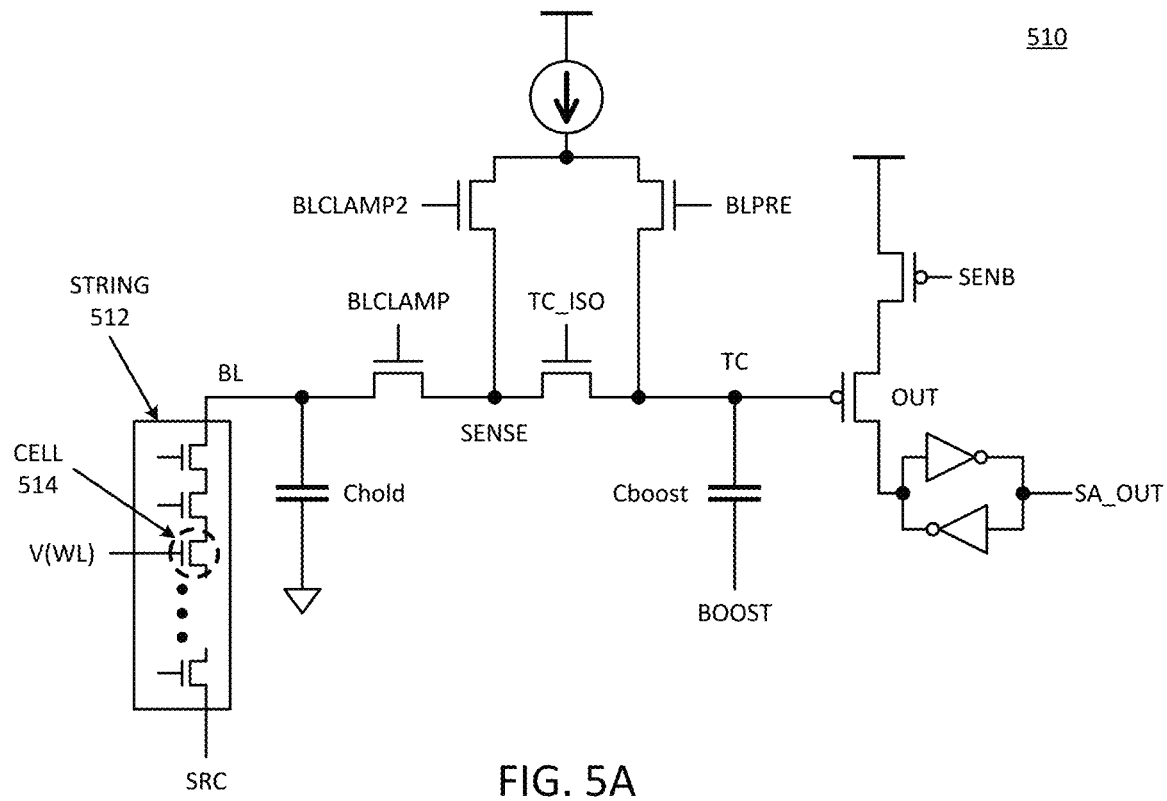
FIG. 5A is a circuit diagram of an example of a sense circuit.

FIG. 5A is a circuit diagram of an example of a sense circuit. Circuit 510 represents a sense circuit. Circuit 510 provides an example of a sense circuit to which a boost can be applied in multiple stages or multiple phases, in accordance with any example described.

String 512 represents a string of cells 514 in a bitline (BL). Multiple cells 514 can be connected between BL and a source (SRC). Application of a sense voltage on the wordline (V(WL)) selects the cell for sensing. Chold represents a holding capacitor that can be charged by cell 514 to identify the voltage level of the cell. BLCLAMP represents a switch that can selectively connect or isolate string 512 to the sense circuit. When BLCLAMP is open, the selected cell of the string can charge Chold, which can then be read when BLCLAMP is closed.

The node after BLCLAMP is labeled as "SENSE", referring to a sense node. In one example, the sense node includes the node labeled SENSE as well as the node labeled TC. TC represents the output sense node, which can be boosted by BOOST from a voltage/power source that charges Cboost. In one example, Cboost is a boost circuit or is part of a boost circuit. Cboost is a boost capacitor having one terminal connected to the boost source and the other terminal (TC) connected to the gate of output transistor OUT.

TC_ISO enables circuit 510 to selectively isolate TC from SENSE for boost operation. BOOST can be a multistage boost source in accordance with any example described. SENSE is a sense node before the application of the boost, and TC is the sense node with the boost applied. BLPRE can provide a voltage to TC to precharge the sense output node. BLCLAMP2 can provide a clamp voltage to sense, preventing the node from discharging too much during tsense. SENB controls a switch that selectively allows OUT to provide the sensed output to a transceiver circuit to provide SA_OUT (sense amplifier output).

In one example, the reference discharge (DV or Vdischarge) of the sense node for a cell with Vt identical to the gate voltage of an output transistor is equal to the absolute Vt of a PMOS (P-type (hole majority carrier) metal oxide semiconductor) transistor in the sense amplifier, such as the transistor OUT in circuit 510. The amount of time given to discharge (tsense) determines the sense current (Isense_PV=C_TC*DV/tsense; where C_TC is the capacitance of the TC node).

OUT represents output transistor to drive a sense output (SA_OUT), which can be driven through an output circuit. The node SENSE can drive the gate of the output transistor to drive the output. BLPRE can be part of or represent a precharge circuit to precharge the sense node and the gate of the output transistor to a voltage reference prior to the sense operation that passes the memory cell value to the sense node. The sense operation passes the memory cell value by conducting current to the read the memory cell value and provide the value at the output. Cboost is included in or represents a boost circuit to boost the sense node. BOOST performs a boost of a first boost voltage to Cboost during the precharge, which will bias the boost circuit and lower the full boost applied on boost up to the sense node. Cboost applies a second boost higher than the first boost voltage to TC during the boost phase. Cboost then responds to the BOOST signal after sensing to boost the sense node down by the full boost voltage, resulting in boosting down by more than the boost up.

In one example, the boost circuit includes a boost capacitor having a top plate or top terminal coupled to gate of the output transistor and a bottom plate coupled to a boost driver. The boost driver controls the boost to the boost circuit and boosts the sense node through the boost capacitor.

TC_ISO can control an isolation switch to selectively couple the sense node to the gate of the output transistor. BLCLAMP can control a clamp switch, after the boost by the second boost voltage, to connect the memory cell output to the sense node to discharge the sense node from the second boost voltage for a time Tsense. The discharge period can sufficiently discharge the sense node to read either a normal PV cell (a non-SSPC cell) or an SSPC cell. The sense circuit can apply a boost after discharge and boost down of the sense node for an SSPC cell to return the sense node to a discharge level equal to or approximately the same as a non-SSPC cell.

Figure 5B:
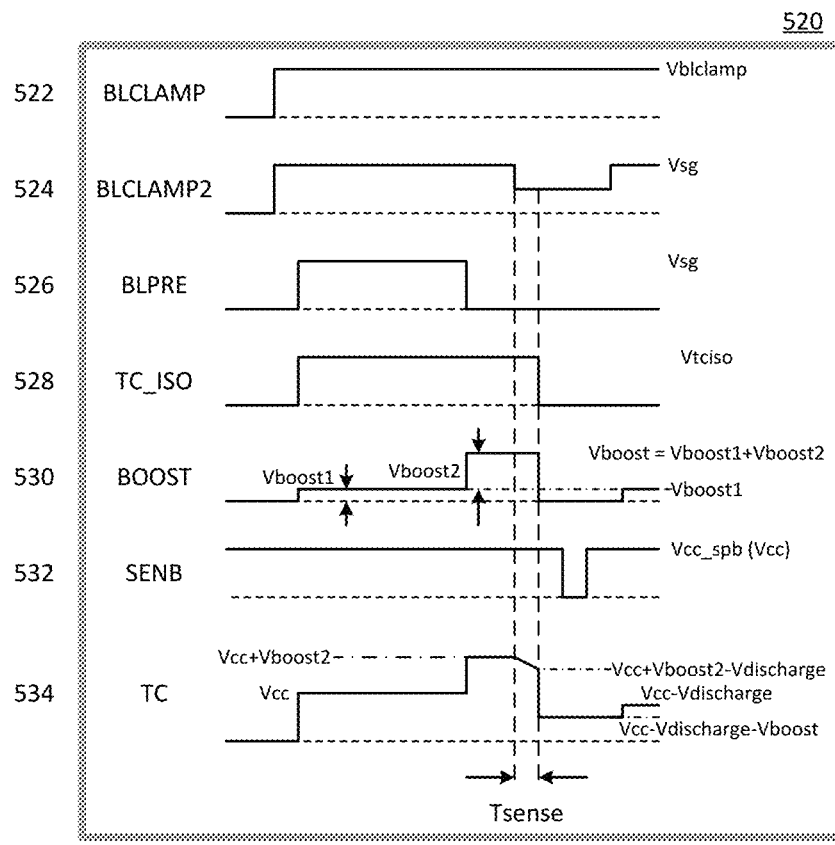
FIG. 5B is a diagrammatic representation of an example of voltage operation at various nodes of the circuit of FIG. 5A.

FIG. 5B is a diagrammatic representation of an example of voltage operation at various nodes of the circuit of FIG. 5A. Diagram 520 represents a timing diagram for the different voltage operations at the specified nodes of circuit 510.

Curve 522 represents the voltage at BLCLAMP, which gets raised from 0 V to a level Vblclamp for the entire precharge, boost, and discharge time. Curve 524 represents the voltage at BLCLAMP2, which can be raised from 0 V to a level Vsg when BLCLAMP is raised to Vblclamp. BLCLAMP2 can be lowered at the time of discharge of the sense node before being raised back up to Vsg.

Curve 526 represents the voltage at BLPRE. After BLCLAMP is raised to Vblclamp, BLPRE can be enabled by raising the voltage from 0 V to Vsg. In response to turning on the switch, the TC node gets precharged. Curve 528 represents the voltage at TC_ISO. In one example, at the same time that BLPRE is turned on, TC_ISO is also asserted with a voltage going from 0 V to Vtciso, to connect SENSE to TC for precharge, boost, and discharge. Having TC_ISO deasserted initially can allow the selected memory cell to charge Chold instead of immediately trying to charge both Chold and Cboost. BLPRE transitions from Vsg back to 0 V prior to initiating the boost. In one example, TC_ISO remains asserted until the boost and sense operations are completed.

Curve 530 represents the voltage at BOOST. In one example, when BLPRE is enabled, BOOST can be raised from 0 V to Vboost1. In one example, BOOST is raised to Vboost1 at some point during precharge, but not right at the beginning. In one example, at the end of precharge, when BLPRE is deasserted, the boost operation begins, and BOOST is boosted another Vboost2 to Vboost. Despite applying the full Vboost to circuit 510, the application of the preboost during precharge results in only the second portion of the boost voltage (Vboost2) being applied to the sense node. After the completion of the discharge operation (at the end of Tsense), BOOST can be down boosted from Vboost back to 0 V, resulting an application of only Vboost2 to the sense node during the boost operation, but the application of −Vboost to the sense node at the end of the discharge operation.

Curve 532 represents the voltage at SENB, which enables the sense output. The sense node is allowed to charge without triggering an output on OUT due to SENB holding the output transistor off. After the precharge, boost, and discharge, SENB can be enabled to provide the SA_OUT signal.

Curve 534 represents the voltage at TC. In one example, TC is charged to Vcc during the precharge phase (when BLPRE is asserted). When BLPRE is deasserted, the voltage from BOOST is applied to the TC, raising the voltage to Vcc+Vboost2. When BLCLAMP2 is asserted and the discharge period initiates, TC discharges for Tsense, until BOOST is boosted down by Vboost. The discharge results in a voltage of Vcc+Vboost2−Vdischarge on TC. The boost down lowers TC to Vcc−Vdischarge−Vboost (or Vcc−Vdischarge+Vboost1). After the sensing in response to SENB being enabled, in one example, BOOST can provide a boost to TC to raise the TC voltage level to the level it would have been at in a traditional operation. Thus, in one example, BOOST boosts TC by Vboost1.

Figure 6:
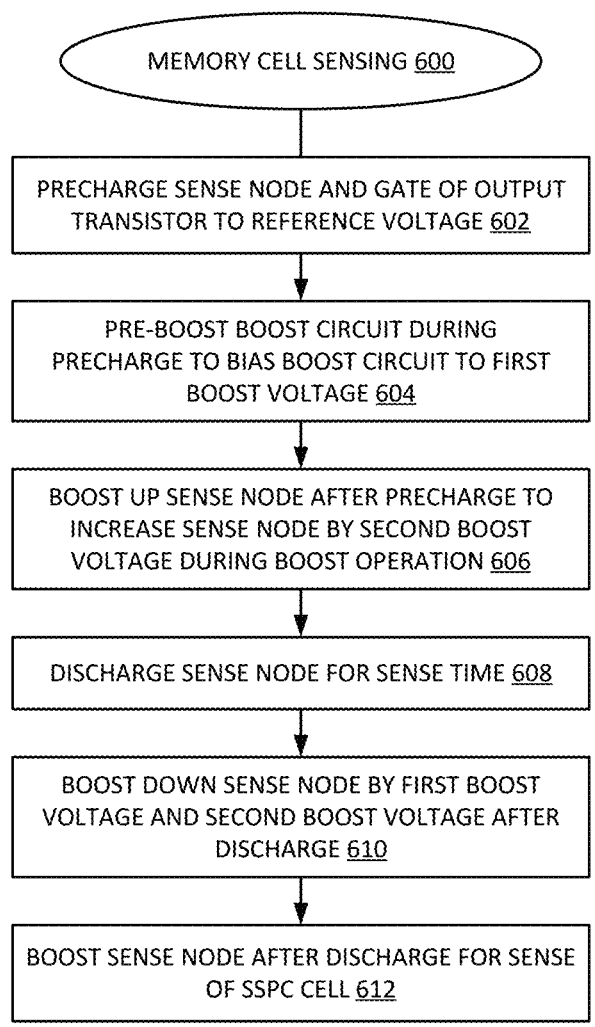
FIG. 6 is a flow diagram of an example of a process for sensing a memory cell with a multistage boost operation.

FIG. 6 is a flow diagram of an example of a process for sensing a memory cell with a multistage boost operation. Process 600 is an example of memory cell sensing with a multistage boost operation for a sense circuit in accordance with an example of circuit 510. In one example, the system precharges the sense node and a gate of an output transistor to a reference voltage, at 602. In one example, the system also pre-boosts the boost circuit during precharge to a first boost voltage to bias the boost circuit, at 604.

During a boost operation, the system boosts the sense node up to increase the voltage on the sense node by a second boost voltage, at 606. The second boost voltage is typically larger than the first boost voltage, where the first and second boost voltages combined equal a traditional boost voltage. During a discharge operation after boost, the system discharges the sense node for the sense time, at 608.

In one example, the system boosts the sense node down by the full boost of the first boost voltage and the second boost voltage after the discharge operation, at 610. The sense circuit can provide the output of the operation. In one example, the boost circuit boosts the sense node after the discharge for sense of an SSPC cell, at 612.

Figure 7A:
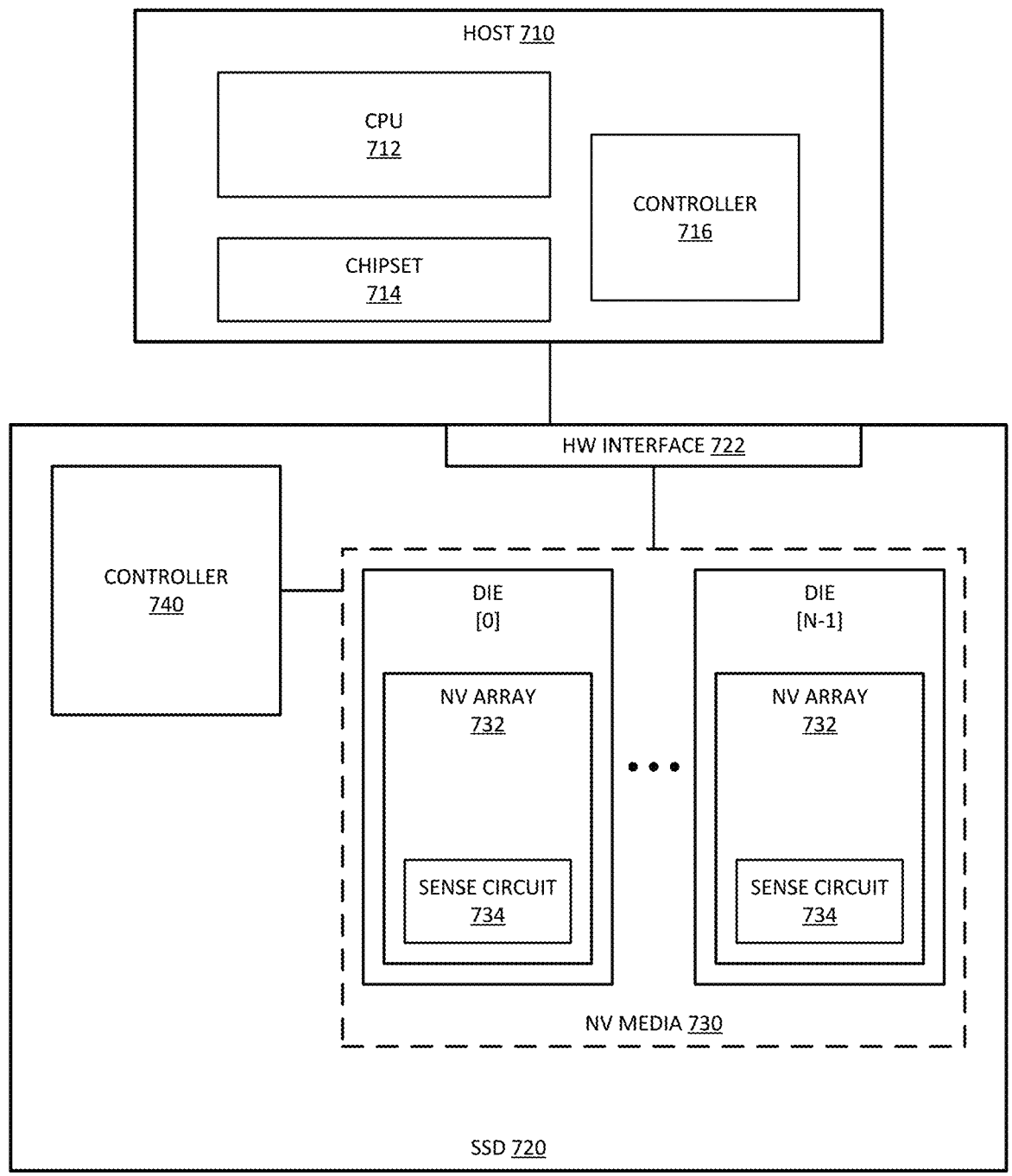
FIG. 7A is a block diagram of an example of a system with a hardware view of a solid state drive (SSD) with a nonvolatile array having sense circuitry that performs multistage boost.

FIG. 7A is a block diagram of an example of a system with a hardware view of a solid state drive (SSD) with a nonvolatile array having sense circuitry that performs multistage boost. System 702 represents components of a nonvolatile storage system that can implement a multistage boost in accordance with an example of diagram 430, or circuit 510.

System 702 includes SSD 720 coupled with host 710. Host 710 represents a host hardware platform that connects to SSD 720. Host 710 includes CPU (central processing unit) 712 or other processor as a host processor or host processor device. CPU 712 represents any host processor that generates requests to access data stored on SSD 720, either to read the data or to write data to the storage. Such a processor can include a single or multicore processor, a primary processor for a computing device, a graphics processor, a peripheral processor, or a supplemental or auxiliary processor, or a combination. CPU 712 can execute a host OS and other applications to cause the operation of system 702.

Host 710 includes chipset 714, which represents hardware components that can be included in connecting between CPU 712 and SSD 720. For example, chipset 714 can include interconnect circuits and logic to enable access to SSD 720. Thus, host platform 710 can include a hardware platform drive interconnect to couple SSD 720 to host 710. Host 710 includes hardware to interconnect to the SSD. Likewise, SSD 720 includes corresponding hardware to interconnect to host 710.

Host 710 includes controller 716, which represents a storage controller or memory controller on the host side to control access to SSD 720. In one example, controller 716 is included in chipset 714. In one example, controller 716 is included in CPU 712. Controller 716 can be referred to as an NV memory controller to enable host 710 to schedule and organize commands to SSD 720 to read and write data.

SSD 720 represents a solid-state drive or other storage system or module that includes nonvolatile (NV) media 730 to store data. SSD 720 includes HW (hardware) interface 722, which represents hardware components to interface with host 710. For example, HW interface 722 can interface with one or more buses to implement a high speed interface standard such as NVMe (nonvolatile memory express) or PCIe (peripheral component interconnect express).

In one example, SSD 720 includes NV (nonvolatile) media 730 as the primary storage for SSD 720. In one example, NV media 730 is or includes a block addressable memory technology, such as NAND (not AND) or NOR (not OR). In one example, NV media 730 can include a nonvolatile, block addressable media, a nonvolatile, byte addressable media, or a nonvolatile media that can be byte addressable or block addressable. In one example, the nonvolatile media stores data based on a resistive state of the memory cell, or a phase of the memory cell. For example, NV media 730 can be or include a three dimensional crosspoint (3DXP) memory or a storage array based on chalcogenide phase change material (e.g., chalcogenide glass). In one example, the NV media can be or include multi-threshold level NAND flash memory, NOR flash memory, single or multi-level phase change memory (PCM) or phase change memory with a switch (PCMS), a resistive memory, nanowire memory, ferroelectric transistor random access memory (FeTRAM), magnetoresistive random access memory (MRAM) memory that incorporates memristor technology, or spin transfer torque (STT)-MRAM, or a combination of any of the above, or other memory. In one example, NV media 730 includes 3D NAND cells.

In one example, NV media 730 is implemented as multiple dies, illustrated as N dies, Die[0:{N−1}]. N can be any number of devices, and is often a binary number. SSD 720 includes controller 740 to control access to NV media 730. Controller 740 represents hardware and control logic within SSD 720 to execute control over the media. Controller 740 is internal to the nonvolatile storage device or module, and is separate from controller 716 of host 710. The NV dies of NV media 730 include NV array 732. In one example, NV array 732 is a 3D memory array.

In one example, NV array 732 includes sense circuit 734 for sensing the values stored in the memory cells of the NV array. Sense circuit 734 enables SSD 720 to read cells of NV array 732 with a multistage boost operation, in accordance with any example described. The multistage boost enables application of a lower boost voltage to a sense node during boost, while boosting down the full discharge voltage to enable the ability to properly distinguish between SSPC cells and non-SSPC cells.

Figure 7B:
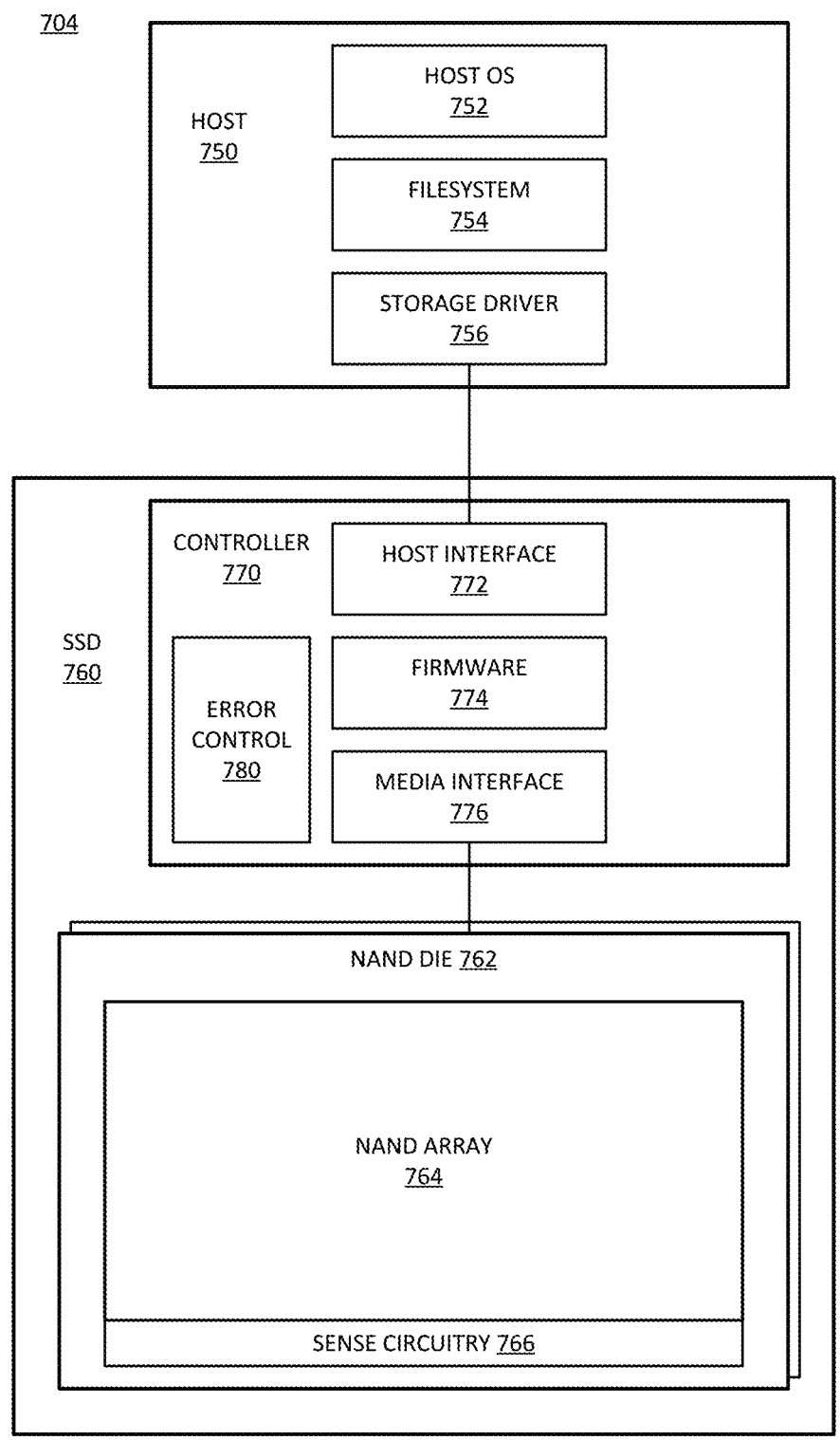
FIG. 7B is a block diagram of an example of a logical view of system with a solid state drive (SSD) with a nonvolatile array having sense circuitry that performs multistage boost.

FIG. 7B is a block diagram of an example of a logical view of system with a solid state drive (SSD) with a nonvolatile array having sense circuitry that performs multistage boost. System 704 illustrates a system with a nonvolatile memory array in accordance with an example of system 702 of FIG. 7A.

System 704 illustrates the logical layers of the host and SSD of a hardware platform in accordance with system 702. System 704 can represent software and firmware components of an example of system 702, as well as physical components. In one example, host 750 provides one example of host 710. In one example, SSD 760 provides one example of SSD 720.

In one example, host 750 includes host OS 752, which represents a host operating system or software platform for the host. Host OS 752 can include a platform on which applications, services, agents, and/or other software executes, and is executed by a processor. Filesystem 754 represents control logic for controlling access to the NV media. Filesystem 754 can manage what addresses or memory locations are used to store what data. There are numerous filesystems known, and filesystem 754 can implement known filesystems or other proprietary systems. In one example, filesystem 754 is part of host OS 752.

Storage driver 756 represents one or more system-level modules that control the hardware of host 750. In one example, drivers 756 include a software application to control the interface to SSD 760, and thus control the hardware of SSD 760. Storage driver 756 can provide a communication interface between the host and the SSD.

Controller 770 of SSD 760 includes firmware 774, which represents control software/firmware for the controller. In one example, controller 770 includes host interface 772, which represents an interface to host 750. In one example, controller 770 includes media interface 776, which represents an interface to NAND die 762. NAND die 762 represents a specific example of NV media, and includes an associated 3D NAND array 764. NAND array 764 includes an array of memory cells.

Media interface 776 represent control that is executed on hardware of controller 770. It will be understood that controller 770 includes hardware to interface with host 750, which can be considered to be controlled by host interface software/firmware 774. Likewise, it will be understood that controller 770 includes hardware to interface with NAND die 762. In one example, code for host interface 772 can be part of firmware 774. In one example, code for media interface 776 can be part of firmware 774.

In one example, controller 770 includes error control 780 to handle data errors in accessed data, and corner cases in terms of compliance with signaling and communication interfacing. Error control 780 can include implementations in hardware or firmware, or a combination of hardware and software.

In one example, NAND die 762 includes sense circuitry 766 for sensing the values stored in the memory cells of the NAND array. Sense circuitry 766 enables SSD 760 to read cells of NAND array 764 with a multistage boost operation, in accordance with any example described. The multistage boost enables application of a lower boost voltage to a sense node during boost, while boosting down the full discharge voltage to enable the ability to properly distinguish between SSPC cells and non-SSPC cells.

Figure 8:
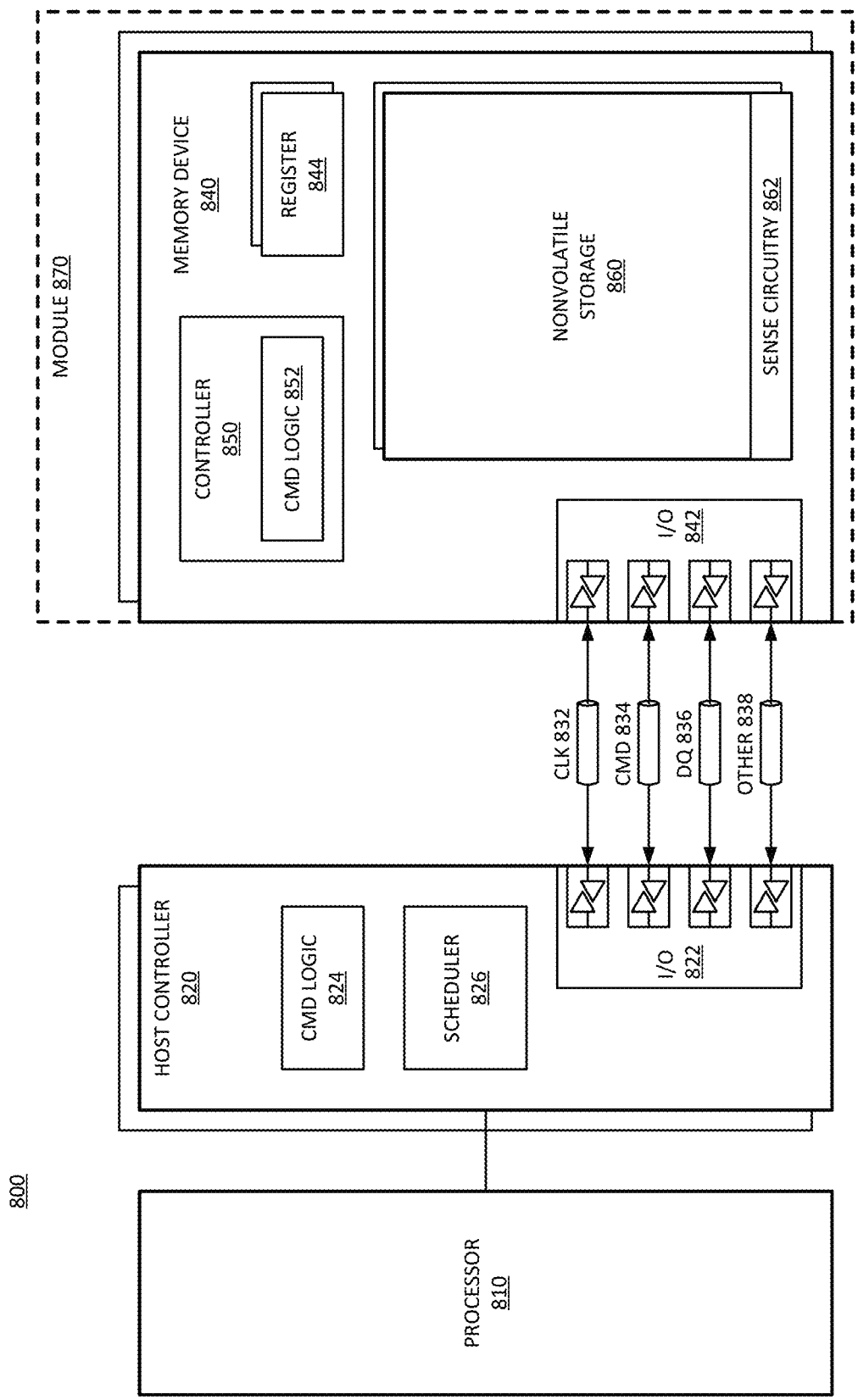
FIG. 8 is a block diagram of an example of a memory subsystem in which a nonvolatile array having sense circuitry that performs multistage boost can be implemented.

FIG. 8 is a block diagram of an example of a memory subsystem in which a nonvolatile array having sense circuitry that performs multistage boost can be implemented. System 800 includes a processor and elements of a memory subsystem in a computing device.

In one example, nonvolatile storage 860 includes sense circuitry 862 for sensing the values stored in the memory cells of the nonvolatile storage array. Sense circuitry 862 enables memory device 840 to read cells of nonvolatile storage 860 with a multistage boost operation, in accordance with any example described. The multistage boost enables application of a lower boost voltage to a sense node during boost, while boosting down the full discharge voltage to enable the ability to properly distinguish between SSPC cells and non-SSPC cells.

Processor 810 represents a processing unit of a computing platform that may execute an operating system (OS) and applications, which can collectively be referred to as the host or the user of the memory. The OS and applications execute operations that result in memory accesses. Processor 810 can include one or more separate processors. Each separate processor can include a single processing unit, a multicore processing unit or multicore processor, or a combination. The processing unit can be a primary processor such as a CPU (central processing unit), a peripheral processor such as a GPU (graphics processing unit), or a combination. Memory accesses may also be initiated by devices such as a network controller or hard disk controller. Such devices can be integrated with the processor in some systems or attached to the processer via a bus (e.g., PCI express), or a combination. System 800 can be implemented as an SOC (system on a chip), or be implemented with standalone components.

Reference to memory devices can apply to different memory types, including nonvolatile memory devices whose state is determinate even if power is interrupted to the device. In one example, the nonvolatile memory device is a block addressable memory device, such as NAND or NOR technologies. Thus, a memory device can also include a future generation nonvolatile devices, such as a three dimensional crosspoint (3DXP) memory device, other byte addressable or block addressable nonvolatile memory devices, or memory devices that use chalcogenide phase change material (e.g., chalcogenide glass). In one example, the memory device can be or include multi-threshold level NAND flash memory, NOR flash memory, single or multi-level phase change memory (PCM) or phase change memory with a switch (PCMS), a resistive memory, nanowire memory, ferroelectric transistor random access memory (FeTRAM), magnetoresistive random access memory (MRAM) memory that incorporates memristor technology, or spin transfer torque (STT)-MRAM, or a combination of any of the above, or other memory.

Memory controller 820 represents one or more memory controller circuits or devices for system 800. Memory controller 820 represents control logic that generates memory access commands in response to the execution of operations by processor 810. Memory controller 820 accesses one or more memory devices 840. Memory devices 840 are coupled to memory controller 820. Coupling can refer to an electrical coupling, communicative coupling, physical coupling, or a combination of these. Physical coupling can include direct contact. Electrical coupling includes an interface or interconnection that allows electrical flow between components, or allows signaling between components, or both. Communicative coupling includes connections, including wired or wireless, that enable components to exchange data.

Memory controller 820 includes I/O interface logic 822 to couple to a memory bus, such as a memory channel as referred to above. I/O interface logic 822 (as well as I/O interface logic 842 of memory device 840) can include pins, pads, connectors, signal lines, traces, or wires, or other hardware to connect the devices, or a combination of these. I/O interface logic 822 can include a hardware interface. As illustrated, I/O interface logic 822 includes at least drivers/transceivers for signal lines. Commonly, wires within an integrated circuit interface couple with a pad, pin, or connector to interface signal lines or traces or other wires between devices. I/O interface logic 822 can include drivers, receivers, transceivers, or termination, or other circuitry or combinations of circuitry to exchange signals on the signal lines between the devices. The exchange of signals includes at least one of transmit or receive. While shown as coupling I/O 822 from memory controller 820 to I/O 842 of memory device 840, it will be understood that in an implementation of system 800 where groups of memory devices 840 are accessed in parallel, multiple memory devices can include I/O interfaces to the same interface of memory controller 820. In an implementation of system 800 including one or more memory modules 870, I/O 842 can include interface hardware of the memory module in addition to interface hardware on the memory device itself. Other memory controllers 820 will include separate interfaces to other memory devices 840.

The bus between memory controller 820 and memory devices 840 can be implemented as multiple signal lines coupling memory controller 820 to memory devices 840. The bus may typically include at least clock (CLK) 832, command/address (CMD) 834, and write data (DQ) and read data (DQ) 836, and zero or more other signal lines 838. In one example, a bus or connection between memory controller 820 and memory can be referred to as a memory bus. The signal lines for CMD enables memory controller 820 to provide commands to memory device 840. DQ 836 enable the exchange of data between the devices, and can be referred to as a "data bus." In one example, independent channels have different clock signals, C/A buses, data buses, and other signal lines. Thus, system 800 can be considered to have multiple "buses," in the sense that an independent interface path can be considered a separate bus. It will be understood that in addition to the lines explicitly shown, a bus can include at least one of strobe signaling lines, alert lines, auxiliary lines, or other signal lines, or a combination. It will also be understood that serial bus technologies can be used for the connection between memory controller 820 and memory devices 840. Other signals 838, such as strobe lines DQS, can accompany a bus or sub bus.

In one example, memory devices 840 are disposed directly on a motherboard or host system platform (e.g., a PCB (printed circuit board) on which processor 810 is disposed) of a computing device. In one example, memory devices 840 can be organized into memory modules 870. In one example, memory modules 870 represent dual inline memory modules (DIMMs). In one example, memory modules 870 represent other organization of multiple memory devices to share at least a portion of access or control circuitry, which can be a separate circuit, a separate device, or a separate board from the host system platform. Memory modules 870 can include multiple memory devices 840, and the memory modules can include support for multiple separate channels to the included memory devices disposed on them. In another example, memory devices 840 may be incorporated into the same package as memory controller 820, such as by techniques such as multi-chip-module (MCM), package-on-package, through-silicon via (TSV), or other techniques or combinations. Similarly, in one example, multiple memory devices 840 may be incorporated into memory modules 870, which themselves may be incorporated into the same package as memory controller 820. It will be appreciated that for these and other implementations, memory controller 820 may be part of host processor 810.

Memory devices 840 each include nonvolatile storage 860, which represents the individual arrays of memory locations or storage locations for data. Typically, nonvolatile storage 860 is managed as rows of data, accessed via wordline (rows) and bitline (individual bits within a row) control. Nonvolatile storage 860 can be organized as separate channels or ranks of memory. Channels refer to independent control paths to storage locations within memory devices 840. Ranks refer to common locations across multiple memory devices (e.g., same row addresses within different devices).

In one example, memory devices 840 include one or more registers 844. Register 844 represents one or more storage devices or storage locations that provide configuration or settings for the operation of the memory device. In one example, register 844 can provide a storage location for memory device 840 to store data for access by memory controller 820 as part of a control or management operation. In one example, register 844 includes one or more Mode Registers. In one example, register 844 includes one or more multipurpose registers. The configuration of locations within register 844 can configure memory device 840 to operate in different "modes," where command information can trigger different operations within memory device 840 based on the mode. Additionally, or in the alternative, different modes can also trigger different operation from address information or other signal lines depending on the mode. Settings of register 844 can indicate configuration for I/O settings (e.g., timing, termination or ODT (on-die termination), driver configuration, or other I/O settings).

Memory device 840 includes controller 850, which represents control logic within the memory device to control internal operations within the memory device. For example, controller 850 decodes commands sent by memory controller 820 and generates internal operations to execute or satisfy the commands. Controller 850 can be referred to as an internal controller, and is separate from memory controller 820 of the host. Controller 850 can determine what mode is selected based on register 844, and configure the internal execution of operations for access to nonvolatile storage 860 or other operations based on the selected mode. Controller 850 generates control signals to control the routing of bits within memory device 840 to provide a proper interface for the selected mode and direct a command to the proper memory locations or addresses. Controller 850 includes command logic 852, which can decode command encoding received on command and address signal lines. Thus, command logic 852 can be or include a command decoder. With command logic 852, memory device can identify commands and generate internal operations to execute requested commands.

Referring again to memory controller 820, memory controller 820 includes command (CMD) logic 824, which represents logic or circuitry to generate commands to send to memory devices 840. The generation of the commands can refer to the command prior to scheduling, or the preparation of queued commands ready to be sent. Generally, the signaling in memory subsystems includes address information within or accompanying the command to indicate or select one or more memory locations where the memory devices should execute the command. In response to scheduling of transactions for memory device 840, memory controller 820 can issue commands via I/O 822 to cause memory device 840 to execute the commands. In one example, controller 850 of memory device 840 receives and decodes command and address information received via I/O 842 from memory controller 820. Based on the received command and address information, controller 850 can control the timing of operations of the logic and circuitry within memory device 840 to execute the commands. Controller 850 is responsible for compliance with standards or specifications within memory device 840, such as timing and signaling requirements. Memory controller 820 can implement compliance with standards or specifications by access scheduling and control.

Memory controller 820 includes scheduler 826, which represents logic or circuitry to generate and order transactions to send to memory device 840. From one perspective, the primary function of memory controller 820 could be said to schedule memory access and other transactions to memory device 840. Such scheduling can include generating the transactions themselves to implement the requests for data by processor 810 and to maintain integrity of the data (e.g., such as with commands related to refresh). Transactions can include one or more commands, and result in the transfer of commands or data or both over one or multiple timing cycles such as clock cycles or unit intervals. Transactions can be for access such as read or write or related commands or a combination, and other transactions can include memory management commands for configuration, settings, data integrity, or other commands or a combination.

Memory controller 820 typically includes logic such as scheduler 826 to allow selection and ordering of transactions to improve performance of system 800. Thus, memory controller 820 can select which of the outstanding transactions should be sent to memory device 840 in which order, which is typically achieved with logic much more complex that a simple first-in first-out algorithm. Memory controller 820 manages the transmission of the transactions to memory device 840, and manages the timing associated with the transaction. In one example, transactions have deterministic timing, which can be managed by memory controller 820 and used in determining how to schedule the transactions with scheduler 826.

Figure 9:
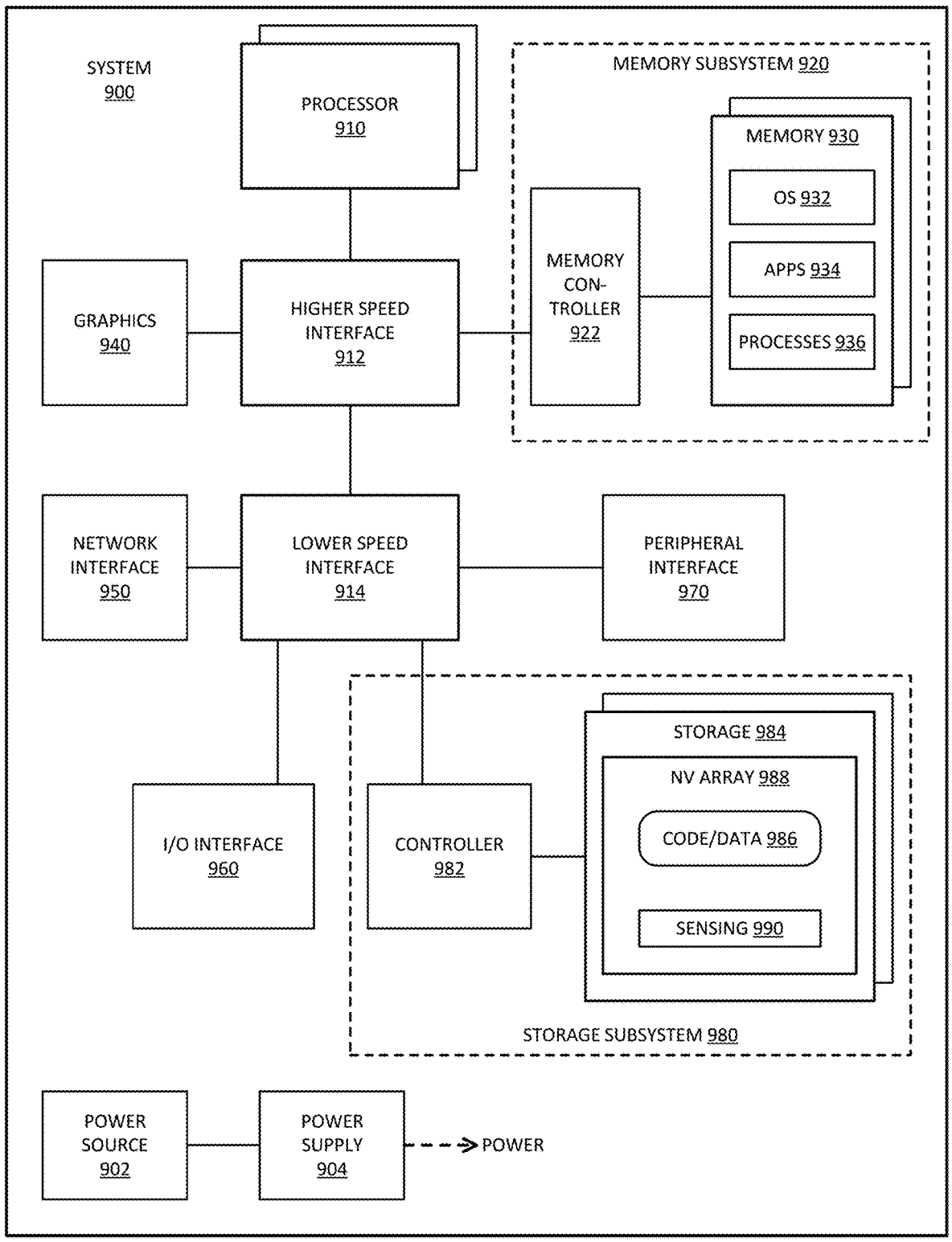
FIG. 9 is a block diagram of an example of a computing system in which a nonvolatile array having sense circuitry that performs multistage boost can be implemented.

FIG. 9 is a block diagram of an example of a computing system in which a nonvolatile array having sense circuitry that performs multistage boost can be implemented. System 900 represents a computing device in accordance with any example herein, and can be a laptop computer, a desktop computer, a tablet computer, a server, a gaming or entertainment control system, embedded computing device, or other electronic device. System 900 provides an example of a system that can include an SSD in accordance with system 702 or system 704, or another storage device.

In one example, system 900 includes storage 984 with NV array 988. NV array 988 can be, for example, a 3D NAND array or a 3DXP array. NV array 988 includes sensing to represent sense circuitry 990 that can perform sensing based on a multistage boost operation in accordance with any description herein.

System 900 includes processor 910 can include any type of microprocessor, central processing unit (CPU), graphics processing unit (GPU), processing core, or other processing hardware, or a combination, to provide processing or execution of instructions for system 900. Processor 910 can be a host processor device. Processor 910 controls the overall operation of system 900, and can be or include, one or more programmable general-purpose or special-purpose microprocessors, digital signal processors (DSPs), programmable controllers, application specific integrated circuits (ASICs), programmable logic devices (PLDs), or a combination of such devices.

In one example, system 900 includes interface 912 coupled to processor 910, which can represent a higher speed interface or a high throughput interface for system components that need higher bandwidth connections, such as memory subsystem 920 or graphics interface components 940. Interface 912 represents an interface circuit, which can be a standalone component or integrated onto a processor die. Interface 912 can be integrated as a circuit onto the processor die or integrated as a component on a system on a chip. Where present, graphics interface 940 interfaces to graphics components for providing a visual display to a user of system 900. Graphics interface 940 can be a standalone component or integrated onto the processor die or system on a chip. In one example, graphics interface 940 can drive a high definition (HD) display or ultra high definition (UHD) display that provides an output to a user. In one example, the display can include a touchscreen display. In one example, graphics interface 940 generates a display based on data stored in memory 930 or based on operations executed by processor 910 or both.

Memory subsystem 920 represents the main memory of system 900, and provides storage for code to be executed by processor 910, or data values to be used in executing a routine. Memory subsystem 920 can include one or more memory devices 930 such as read-only memory (ROM), flash memory, one or more varieties of random-access memory (RAM) such as DRAM, 3DXP (three-dimensional crosspoint), or other memory devices, or a combination of such devices. Memory 930 stores and hosts, among other things, operating system (OS) 932 to provide a software platform for execution of instructions in system 900. Additionally, applications 934 can execute on the software platform of OS 932 from memory 930. Applications 934 represent programs that have their own operational logic to perform execution of one or more functions. Processes 936 represent agents or routines that provide auxiliary functions to OS 932 or one or more applications 934 or a combination. OS 932, applications 934, and processes 936 provide software logic to provide functions for system 900. In one example, memory subsystem 920 includes memory controller 922, which is a memory controller to generate and issue commands to memory 930. It will be understood that memory controller 922 could be a physical part of processor 910 or a physical part of interface 912. For example, memory controller 922 can be an integrated memory controller, integrated onto a circuit with processor 910, such as integrated onto the processor die or a system on a chip.

While not specifically illustrated, it will be understood that system 900 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or other bus, or a combination.

In one example, system 900 includes interface 914, which can be coupled to interface 912. Interface 914 can be a lower speed interface than interface 912. In one example, interface 914 represents an interface circuit, which can include standalone components and integrated circuitry. In one example, multiple user interface components or peripheral components, or both, couple to interface 914. Network interface 950 provides system 900 the ability to communicate with remote devices (e.g., servers or other computing devices) over one or more networks. Network interface 950 can include an Ethernet adapter, wireless interconnection components, cellular network interconnection components, USB (universal serial bus), or other wired or wireless standards-based or proprietary interfaces. Network interface 950 can exchange data with a remote device, which can include sending data stored in memory or receiving data to be stored in memory.

In one example, system 900 includes one or more input/output (I/O) interface(s) 960. I/O interface 960 can include one or more interface components through which a user interacts with system 900 (e.g., audio, alphanumeric, tactile/touch, or other interfacing). Peripheral interface 970 can include any hardware interface not specifically mentioned above. Peripherals refer generally to devices that connect dependently to system 900. A dependent connection is one where system 900 provides the software platform or hardware platform or both on which operation executes, and with which a user interacts.

In one example, system 900 includes storage subsystem 980 to store data in a nonvolatile manner. In one example, in certain system implementations, at least certain components of storage 980 can overlap with components of memory subsystem 920. Storage subsystem 980 includes storage device(s) 984, which can be or include any conventional medium for storing large amounts of data in a nonvolatile manner, such as one or more magnetic, solid state, 3DXP, or optical based disks, or a combination. Storage 984 holds code or instructions and data 986 in a persistent state (i.e., the value is retained despite interruption of power to system 900). Storage 984 can be generically considered to be a "memory," although memory 930 is typically the executing or operating memory to provide instructions to processor 910. Whereas storage 984 is nonvolatile, memory 930 can include volatile memory (i.e., the value or state of the data is indeterminate if power is interrupted to system 900). In one example, storage subsystem 980 includes controller 982 to interface with storage 984. In one example controller 982 is a physical part of interface 914 or processor 910, or can include circuits or logic in both processor 910 and interface 914.

Power source 902 provides power to the components of system 900. More specifically, power source 902 typically interfaces to one or multiple power supplies 904 in system 900 to provide power to the components of system 900. In one example, power supply 904 includes an AC to DC (alternating current to direct current) adapter to plug into a wall outlet. Such AC power can be renewable energy (e.g., solar power) power source 902. In one example, power source 902 includes a DC power source, such as an external AC to DC converter. In one example, power source 902 or power supply 904 includes wireless charging hardware to charge via proximity to a charging field. In one example, power source 902 can include an internal battery or fuel cell source.

Figure 10:
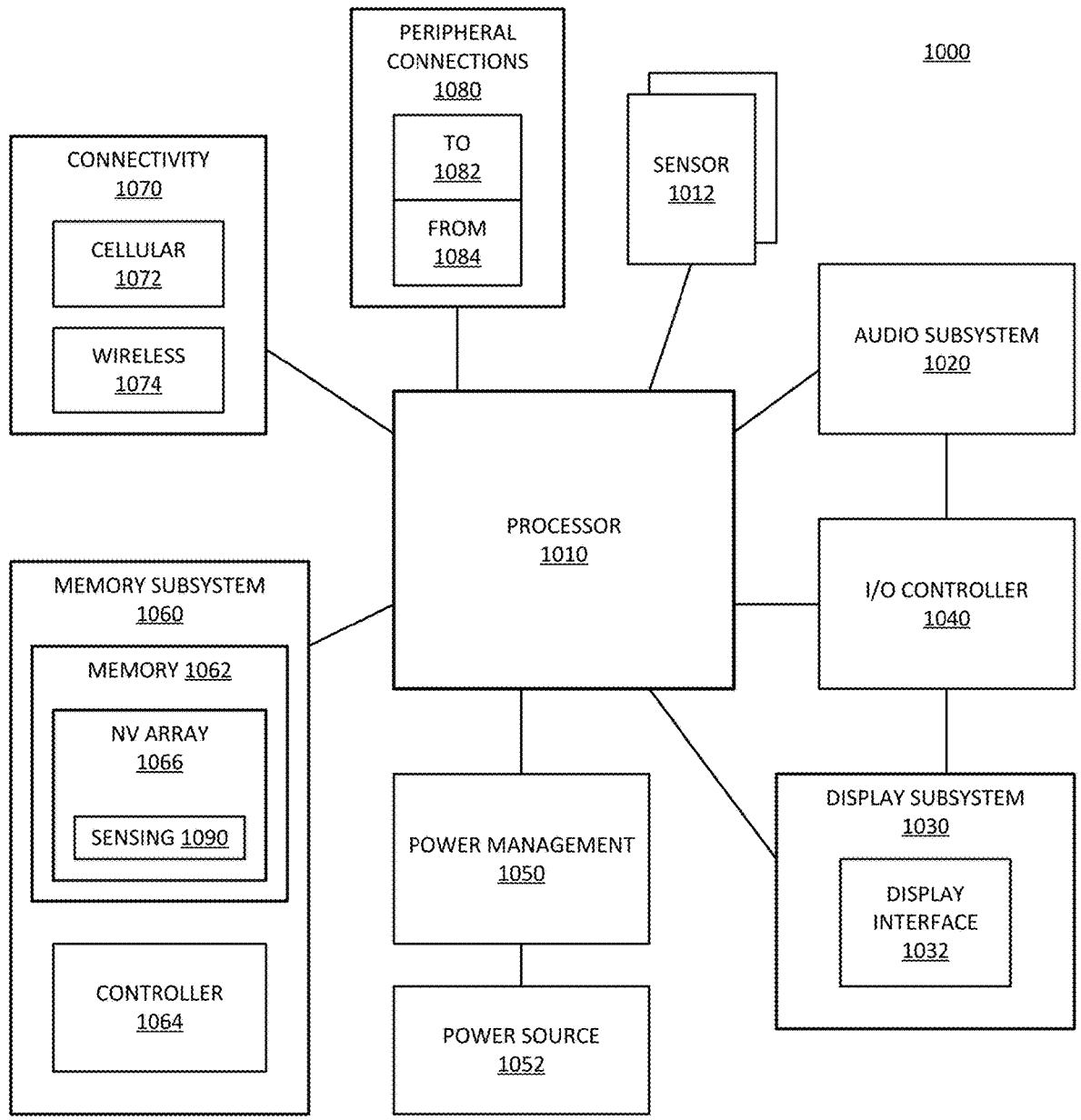
FIG. 10 is a block diagram of an example of a mobile device in which a nonvolatile array having sense circuitry that performs multistage boost can be implemented.

FIG. 10 is a block diagram of an example of a mobile device in which a nonvolatile array having sense circuitry that performs multistage boost can be implemented. System 1000 represents a mobile computing device, such as a computing tablet, a mobile phone or smartphone, wearable computing device, or other mobile device, or an embedded computing device. It will be understood that certain of the components are shown generally, and not all components of such a device are shown in system 1000. System 1000 provides an example of a system that can include a 3D stacked device with a sense circuit in accordance with an example of sense circuit 124.

In one example, system 1000 includes memory 1062 with NV array 1066. NV array 1066 can be, for example, a 3D NAND array or a 3DXP array. NV array 1066 includes sensing 1090 to represent sense circuitry that can perform sensing based on a multistage boost operation in accordance with any description herein.

System 1000 includes processor 1010, which performs the primary processing operations of system 1000. Processor 1010 can be a host processor device. Processor 1010 can include one or more physical devices, such as microprocessors, application processors, microcontrollers, programmable logic devices, or other processing means. The processing operations performed by processor 1010 include the execution of an operating platform or operating system on which applications and device functions are executed. The processing operations include operations related to I/O (input/output) with a human user or with other devices, operations related to power management, operations related to connecting system 1000 to another device, or a combination.

The processing operations can also include operations related to audio I/O, display I/O, or other interfacing, or a combination. Processor 1010 can execute data stored in memory. Processor 1010 can write or edit data stored in memory.

In one example, system 1000 includes one or more sensors 1012. Sensors 1012 represent embedded sensors or interfaces to external sensors, or a combination. Sensors 1012 enable system 1000 to monitor or detect one or more conditions of an environment or a device in which system 1000 is implemented. Sensors 1012 can include environmental sensors (such as temperature sensors, motion detectors, light detectors, cameras, chemical sensors (e.g., carbon monoxide, carbon dioxide, or other chemical sensors)), pressure sensors, accelerometers, gyroscopes, medical or physiology sensors (e.g., biosensors, heart rate monitors, or other sensors to detect physiological attributes), or other sensors, or a combination. Sensors 1012 can also include sensors for biometric systems such as fingerprint recognition systems, face detection or recognition systems, or other systems that detect or recognize user features. Sensors 1012 should be understood broadly, and not limiting on the many different types of sensors that could be implemented with system 1000. In one example, one or more sensors 1012 couples to processor 1010 via a frontend circuit integrated with processor 1010. In one example, one or more sensors 1012 couples to processor 1010 via another component of system 1000.

In one example, system 1000 includes audio subsystem 1020, which represents hardware (e.g., audio hardware and audio circuits) and software (e.g., drivers, codecs) components associated with providing audio functions to the computing device. Audio functions can include speaker or headphone output, as well as microphone input. Devices for such functions can be integrated into system 1000, or connected to system 1000. In one example, a user interacts with system 1000 by providing audio commands that are received and processed by processor 1010.

Display subsystem 1030 represents hardware (e.g., display devices) and software components (e.g., drivers) that provide a visual display for presentation to a user. In one example, the display includes tactile components or touchscreen elements for a user to interact with the computing device. Display subsystem 1030 includes display interface 1032, which includes the particular screen or hardware device used to provide a display to a user. In one example, display interface 1032 includes logic separate from processor 1010 (such as a graphics processor) to perform at least some processing related to the display. In one example, display subsystem 1030 includes a touchscreen device that provides both output and input to a user. In one example, display subsystem 1030 includes a high definition (HD) or ultra-high definition (UHD) display that provides an output to a user. In one example, display subsystem includes or drives a touchscreen display. In one example, display subsystem 1030 generates display information based on data stored in memory or based on operations executed by processor 1010 or both.

I/O controller 1040 represents hardware devices and software components related to interaction with a user. I/O controller 1040 can operate to manage hardware that is part of audio subsystem 1020, or display subsystem 1030, or both. Additionally, I/O controller 1040 illustrates a connection point for additional devices that connect to system 1000 through which a user might interact with the system. For example, devices that can be attached to system 1000 might include microphone devices, speaker or stereo systems, video systems or other display device, keyboard or keypad devices, buttons/switches, or other I/O devices for use with specific applications such as card readers or other devices.

As mentioned above, I/O controller 1040 can interact with audio subsystem 1020 or display subsystem 1030 or both. For example, input through a microphone or other audio device can provide input or commands for one or more applications or functions of system 1000. Additionally, audio output can be provided instead of or in addition to display output. In another example, if display subsystem includes a touchscreen, the display device also acts as an input device, which can be at least partially managed by I/O controller 1040. There can also be additional buttons or switches on system 1000 to provide I/O functions managed by I/O controller 1040.

In one example, I/O controller 1040 manages devices such as accelerometers, cameras, light sensors or other environmental sensors, gyroscopes, global positioning system (GPS), or other hardware that can be included in system 1000, or sensors 1012. The input can be part of direct user interaction, as well as providing environmental input to the system to influence its operations (such as filtering for noise, adjusting displays for brightness detection, applying a flash for a camera, or other features).

In one example, system 1000 includes power management 1050 that manages battery power usage, charging of the battery, and features related to power saving operation. Power management 1050 manages power from power source 1052, which provides power to the components of system 1000. In one example, power source 1052 includes an AC to DC (alternating current to direct current) adapter to plug into a wall outlet. Such AC power can be renewable energy (e.g., solar power, motion based power). In one example, power source 1052 includes only DC power, which can be provided by a DC power source, such as an external AC to DC converter. In one example, power source 1052 includes wireless charging hardware to charge via proximity to a charging field. In one example, power source 1052 can include an internal battery or fuel cell source.

Memory subsystem 1060 includes memory device(s) 1062 for storing information in system 1000. Memory subsystem 1060 can include nonvolatile (state does not change if power to the memory device is interrupted) or volatile (state is indeterminate if power to the memory device is interrupted) memory devices, or a combination. Memory 1060 can store application data, user data, music, photos, documents, or other data, as well as system data (whether long-term or temporary) related to the execution of the applications and functions of system 1000. In one example, memory subsystem 1060 includes memory controller 1064 (which could also be considered part of the control of system 1000, and could potentially be considered part of processor 1010). Memory controller 1064 includes a scheduler to generate and issue commands to control access to memory device 1062.

Connectivity 1070 includes hardware devices (e.g., wireless or wired connectors and communication hardware, or a combination of wired and wireless hardware) and software components (e.g., drivers, protocol stacks) to enable system 1000 to communicate with external devices. The external device could be separate devices, such as other computing devices, wireless access points or base stations, as well as peripherals such as headsets, printers, or other devices. In one example, system 1000 exchanges data with an external device for storage in memory or for display on a display device. The exchanged data can include data to be stored in memory, or data already stored in memory, to read, write, or edit data.

Connectivity 1070 can include multiple different types of connectivity. To generalize, system 1000 is illustrated with cellular connectivity 1072 and wireless connectivity 1074. Cellular connectivity 1072 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), 5G, or other cellular service standards. Wireless connectivity 1074 refers to wireless connectivity that is not cellular, and can include personal area networks (such as Bluetooth), local area networks (such as WiFi), or wide area networks (such as WiMax), or other wireless communication, or a combination. Wireless communication refers to transfer of data through the use of modulated electromagnetic radiation through a non-solid medium. Wired communication occurs through a solid communication medium.

Peripheral connections 1080 include hardware interfaces and connectors, as well as software components (e.g., drivers, protocol stacks) to make peripheral connections. It will be understood that system 1000 could both be a peripheral device ("to" 1082) to other computing devices, as well as have peripheral devices ("from" 1084) connected to it. System 1000 commonly has a "docking" connector to connect to other computing devices for purposes such as managing (e.g., downloading, uploading, changing, synchronizing) content on system 1000. Additionally, a docking connector can allow system 1000 to connect to certain peripherals that allow system 1000 to control content output, for example, to audiovisual or other systems.

In addition to a proprietary docking connector or other proprietary connection hardware, system 1000 can make peripheral connections 1080 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), or other type.

In general with respect to the descriptions herein, in one example a sense circuit includes: an output transistor to drive a sense output; a sense node to drive a gate of the output transistor based on a value read from a memory cell; a precharge circuit to precharge the sense node and the gate of the output transistor to a voltage reference prior to a sense operation; and a boost circuit to boost the sense node, the boost circuit to be boosted up by a first boost voltage during precharge in which the sense node is precharged to the voltage reference, and the boost circuit to boost up the sense node after precharge to increase the voltage of the sense node by a second boost voltage greater than the first boost voltage, and boost down the sense node after the sense operation by a combination of the first boost voltage and the second boost voltage.

In one example, the boost circuit includes a boost capacitor having a top plate coupled to gate of the output transistor and a bottom plate coupled to a boost driver, wherein the boost driver is to boost the sense node through the boost capacitor. In one example, the sense circuit further includes an isolation switch to selectively couple the sense node to the gate of the output transistor. In one example, the sense circuit further includes a clamp switch, after the boost by the second boost voltage, to connect the value read from the memory cell to the sense node to discharge the sense node for a time Tsense. In one example, the discharge from the second boost voltage comprises a discharge sufficient to read an SSPC (selective slow programming convergence) cell. In one example, the boost circuit is further to boost up the sense node after discharge of the sense node, to return the sense node to a discharge level of a non-SSPC cell. In one example, the memory cell comprises a 3D NAND (three-dimensional Not AND) memory cell. In one example, the 3D NAND memory cell comprises a memory cell of one of multiple tiers of 3D NAND memory cells. In one example, the memory cell comprises a 3D (three-dimensional) crosspoint memory cell. In one example, the first boost voltage is a portion of a threshold voltage (Vt) of the output transistor, and the second boost voltage is greater than the Vt of the output transistor.

In general with respect to the descriptions herein, in one example a storage device includes: a three-dimensional (3D) memory array, including a string of bitlines; and a sense circuit coupled to the string of bitlines, the sense circuit including an output transistor to drive a sense output; a sense node to conduct current to read a memory cell, the sense node to drive a gate of the output transistor; a precharge circuit to precharge the sense node and the gate of the output transistor to a voltage reference prior to a sense operation; and a boost circuit to boost the sense node, the boost circuit to be boosted up by a first boost voltage during precharge in which the sense node is precharged to the voltage reference, and the boost circuit to boost up the sense node after precharge to increase the voltage of the sense node by a second boost voltage greater than the first boost voltage, and boost down the sense node after the sense operation by a combination of the first boost voltage and the second boost voltage.

In one example, the boost circuit includes a boost capacitor having a top plate coupled to gate of the output transistor and a bottom plate coupled to a boost driver, wherein the boost driver is to boost the sense node through the boost capacitor. In one example, the sense circuit further includes an isolation switch to selectively couple the sense node to the gate of the output transistor. In one example, the sense circuit further includes a clamp switch, after the boost up by the second boost voltage, to connect the string of bitlines to the sense node to discharge the sense node from the second boost voltage for a time Tsense. In one example, the discharge from the second boost voltage comprises a discharge sufficient to read an SSPC (selective slow programming convergence) cell. In one example, the memory cell comprises a 3D NAND (three-dimensional Not AND) memory cell. In one example, the memory cell comprises a 3D (three-dimensional) crosspoint memory cell. In one example, the first boost voltage is a portion of a threshold voltage (Vt) of the output transistor, and the second boost voltage is greater than the Vt of the output transistor.

In general with respect to the descriptions herein, in one example a method includes: precharging a sense node and a gate of an output transistor to a voltage reference prior to a sense operation; boosting a boost circuit up by a first boost voltage during precharging; boosting up the sense node with the boost circuit after precharge to increase the voltage of the sense node by a second boost voltage greater than the first boost voltage; and boosting down the sense node with the boost circuit after the sense operation by a combination of the first boost voltage and the second boost voltage.

In one example, the method includes connecting the memory cell to the sense node after the boosting by the second boost voltage to discharge the sense node from the second boost voltage for a time Tsense sufficient to read an SSPC (selective slow programming convergence) cell. In one example, the method includes boosting the sense node after discharging the sense node, to return the sense node to a discharge level of a non-SSPC cell. In one example, the first boost voltage is a portion of a threshold voltage (Vt) of the output transistor, and the second boost voltage is greater than the Vt of the output transistor. The method can include operations in accordance with any example of the sense circuit.

In one example, a computer readable storage medium stores code, which when executed by a machine, causes the machine to perform operations in accordance with any example of the method of the prior two paragraphs.

Flow diagrams as illustrated herein provide examples of sequences of various process actions. The flow diagrams can indicate operations to be executed by a software or firmware routine, as well as physical operations. A flow diagram can illustrate an example of the implementation of states of a finite state machine (FSM), which can be implemented in hardware and/or software. Although shown in a particular sequence or order, unless otherwise specified, the order of the actions can be modified. Thus, the illustrated diagrams should be understood only as examples, and the process can be performed in a different order, and some actions can be performed in parallel. Additionally, one or more actions can be omitted; thus, not all implementations will perform all actions.

To the extent various operations or functions are described herein, they can be described or defined as software code, instructions, configuration, and/or data. The content can be directly executable ("object" or "executable" form), source code, or difference code ("delta" or "patch" code). The software content of what is described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to what is disclosed and implementations of the invention without departing from their scope. Therefore, the illustrations and examples herein should be construed in an illustrative, and not a restrictive sense. The scope of the invention should be measured solely by reference to the claims that follow.

What is claimed is:

1. A sense circuit comprising:
   an output transistor to drive a sense output;
   a sense node to drive a gate of the output transistor based on a value read from a memory cell;
   a precharge circuit to precharge the sense node and the gate of the output transistor to a voltage reference prior to a sense operation; and
   a boost circuit to boost the sense node, the boost circuit to be boosted up by a first boost voltage during precharge in which the sense node is precharged to the voltage reference, and the boost circuit to boost up the sense node after precharge to increase the voltage of the sense node by a second boost voltage greater than the first boost voltage, and discharge the sense node after the sense operation by a combination of the first boost voltage and the second boost voltage.

2. The sense circuit of claim 1, wherein the boost circuit includes a boost capacitor having a top plate coupled to gate of the output transistor and a bottom plate coupled to a boost driver, wherein the boost driver is to boost the sense node through the boost capacitor.

3. The sense circuit of claim 1, further comprising:
   an isolation switch to selectively couple the sense node to the gate of the output transistor.

4. The sense circuit of claim 1, further comprising:
   a clamp switch, after the boost by the second boost voltage, to connect the value read from the memory cell to the sense node to discharge the sense node for a time Tsense.

5. The sense circuit of claim 4, wherein the discharge from the second boost voltage comprises a discharge sufficient to read an SSPC (selective slow programming convergence) cell.

6. The sense circuit of claim 5, wherein the boost circuit is further to boost up the sense node after discharge of the sense node, to return the sense node to a discharge level of a non-SSPC cell.

7. The sense circuit of claim 1, wherein the memory cell comprises a 3D NAND (three-dimensional Not AND) memory cell.

8. The sense circuit of claim 7, wherein the 3D NAND memory cell comprises a memory cell of one of multiple tiers of 3D NAND memory cells.

9. The sense circuit of claim 1, wherein the memory cell comprises a 3D (three-dimensional) crosspoint memory cell.

10. The sense circuit of claim 1, wherein the first boost voltage is a portion of a threshold voltage (Vt) of the output transistor, and the second boost voltage is greater than the Vt of the output transistor.

11. A storage device, comprising:
    a three-dimensional (3D) memory array, including a string of bitlines; and
    a sense circuit coupled to the string of bitlines, the sense circuit including
      an output transistor to drive a sense output;
      a sense node to conduct current to read a memory cell, the sense node to drive a gate of the output transistor;
      a precharge circuit to precharge the sense node and the gate of the output transistor to a voltage reference prior to a sense operation; and
      a boost circuit to boost the sense node, the boost circuit to be boosted up by a first boost voltage during precharge in which the sense node is precharged to the voltage reference, and the boost circuit to boost up the sense node after precharge to increase the voltage of the sense node by a second boost voltage greater than the first boost voltage, and discharge the sense node after the sense operation by a combination of the first boost voltage and the second boost voltage.

12. The storage device of claim 11, wherein the boost circuit includes a boost capacitor having a top plate coupled to gate of the output transistor and a bottom plate coupled to a boost driver, wherein the boost driver is to boost the sense node through the boost capacitor.

13. The storage device of claim 11, the sense circuit further comprising:
    an isolation switch to selectively couple the sense node to the gate of the output transistor.

14. The storage device of claim 11, the sense circuit further comprising:
    a clamp switch, after the boost up by the second boost voltage, to connect the string of bitlines to the sense node to discharge the sense node from the second boost voltage for a time Tsense.

15. The storage device of claim 14, wherein the discharge from the second boost voltage comprises a discharge sufficient to read an SSPC (selective slow programming convergence) cell.

16. The storage device of claim 11, wherein the memory cell comprises a 3D NAND (three-dimensional Not AND) memory cell.

17. The storage device of claim 11, wherein the memory cell comprises a 3D (three-dimensional) crosspoint memory cell.

18. The storage device of claim 11, wherein the first boost voltage is a portion of a threshold voltage (Vt) of the output transistor, and the second boost voltage is greater than the Vt of the output transistor.

19. A method for sensing a memory cell, comprising:
    precharging a sense node and a gate of an output transistor to a voltage reference prior to a sense operation;
    boosting a boost circuit up by a first boost voltage during precharging;
    boosting up the sense node with the boost circuit after precharge to increase the voltage of the sense node by a second boost voltage greater than the first boost voltage; and
    discharging the sense node with the boost circuit after the sense operation by a combination of the first boost voltage and the second boost voltage.

20. The method of claim 19, further comprising:
    connecting the memory cell to the sense node after the boosting by the second boost voltage to discharge the sense node from the second boost voltage for a time Tsense sufficient to read an SSPC (selective slow programming convergence) cell.

21. The method of claim 20, further comprising:
    boosting the sense node after discharging the sense node, to return the sense node to a discharge level of a non-SSPC cell.

22. The method of claim 19, wherein the first boost voltage is a portion of a threshold voltage (Vt) of the output transistor, and the second boost voltage is greater than the Vt of the output transistor.

* * * * *